(12) United States Patent
Uchiyama

(10) Patent No.: US 7,049,743 B2
(45) Date of Patent: May 23, 2006

(54) PLANT CULTIVATING METHOD, CULTIVATING DEVICE, AND ITS LIGHTING DEVICE

(76) Inventor: Hisakazu Uchiyama, c/o Cosmo Plant Co., Ltd., 1338-1 Kawai, Fukuroi-shi, Sizuoka (JP)

(*) Notice: Subject to any disclaimer, the term of this patent is extended or adjusted under 35 U.S.C. 154(b) by 279 days.

(21) Appl. No.: 10/332,033

(22) PCT Filed: Apr. 6, 2001

(86) PCT No.: PCT/JP01/03010

§ 371 (c)(1),
(2), (4) Date: Jan. 6, 2003

(87) PCT Pub. No.: WO02/03777

PCT Pub. Date: Jan. 17, 2002

(65) Prior Publication Data

US 2004/0163308 A1 Aug. 26, 2004

(30) Foreign Application Priority Data

Jul. 7, 2000 (JP) ........................... 2000-207334

(51) Int. Cl.
  *H01J 1/62* (2006.01)
  *H01J 63/04* (2006.01)

(52) U.S. Cl. .................. 313/512; 313/506; 313/498
(58) Field of Classification Search ............... 313/512, 313/506, 498, 499, 500; 257/712, 722, 678
  See application file for complete search history.

(56) References Cited

U.S. PATENT DOCUMENTS 6,031,292 A * 2/2000 Murakami et al. .......... 257/778

FOREIGN PATENT DOCUMENTS

| JP | S62-12183 U | 1/1987 |
|---|---|---|
| JP | 02-171125 A | 7/1990 |
| JP | H03-88205 U | 9/1991 |
| JP | 04-144621 A | 5/1992 |
| JP | 06-141714 A | 5/1994 |
| JP | 06-245646 | 9/1994 |
| JP | H07-11704 U | 7/1995 |
| JP | 08-001964 B2 | 1/1996 |
| JP | 9-98665 | 4/1997 |
| JP | 09-275779 | 10/1997 |
| JP | 10-136790 | 5/1998 |
| JP | 2000-106757 | 4/2000 |
| JP | 2000-106757 A | 4/2000 |
| JP | 2000-207933 A | 7/2000 |
| JP | 2001-095383 A | 4/2001 |
| JP | 2001-110216 A | 4/2001 |

OTHER PUBLICATIONS

English Translation of International Preliminary Examination Report for PCT/JP01/03010 completed on Nov. 7, 2002.

* cited by examiner

*Primary Examiner*—Joseph Williams
*Assistant Examiner*—Kevin Quarterman
(74) *Attorney, Agent, or Firm*—Rader, Fishman & Grauer PLLC

(57) ABSTRACT

A plant cultivating device (A), comprising aluminum long square pipe trays (5) for storing plants (35) together with culture solution, a conveyor device (2) for feeding the trays (5) in order in lateral direction, and a lighting device (3), having a number of light-emitting diodes disposed thereon, located over the conveyor device (5), the lighting device (3) being disposed so as to be higher gradually from the upstream side to the downstream side of the conveyor device (2), wherein a funnel-shaped holder (30) holding the upper part of the plant (35) is provided on the upper surface of the tray (5), and a planting conveyor (6) and a harvesting conveyor (7) for supply and retrieval, a reflecting wall (8) provided between these conveyors and the conveyor device (2), and transfer bars (41) for transferring the trays (5) between the conveyor device (2) and the planting and harvesting conveyors (6,7) are installed on the upstream and downstream sides of the conveyor device (2).

5 Claims, 22 Drawing Sheets

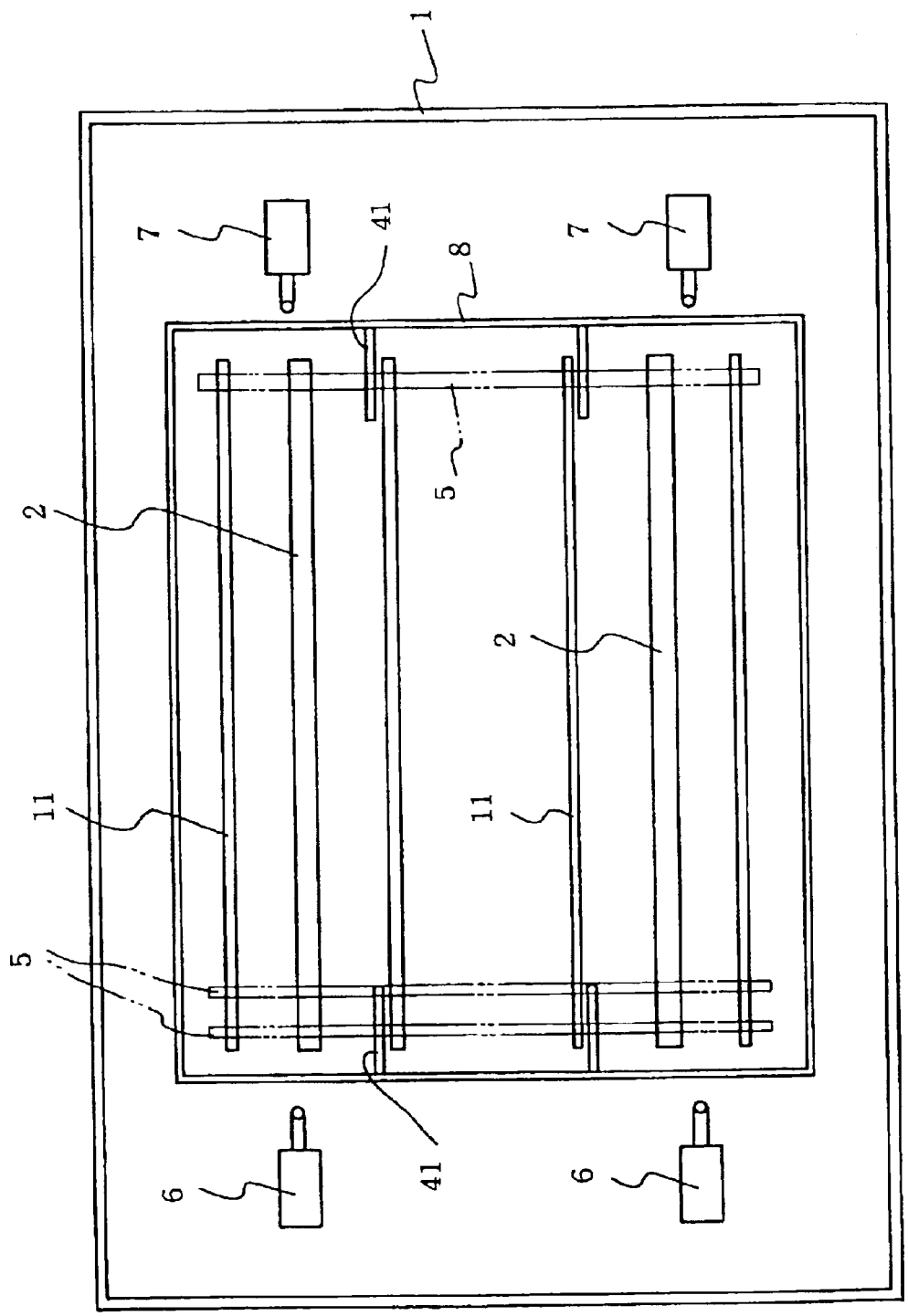

PLANT CULTIVATING METHOD, CULTIVATING DEVICE, AND ITS LIGHTING DEVICE

FIELD OF THE INVENTION

This invention relates generally to a plant cultivating method, a cultivating device, and its lighting device, and more particularly to a so-called industrial cultivating method, a cultivating device, and its suitable lighting device, wherein seeds or seedlings are planted in trays to which culture solution containing water and nutriments supplied through a feed-water pipe, trays being carried by a conveyor device and illuminated by artificial daylight (in some cases, natural daylight).

In addition, plants described herein include vegetables, fruits, and mushrooms etc.

DESCRIPTION OF BACKGROUND ART

This kind of plant cultivating device has been invented by the applicant. For example, in the Japanese Unexamined Patent Publication No. 245646/1994, a multistory work bench as a plant cultivating device is disclosed. The bench has a number of trays hanged by a chain conveyor circulating in a building, wherein the cultivating process of plants is so automated that only supply and retrieval of trays to and from the conveyor is done by workers, seedlings being planted in the trays. And in the Japanese Unexamined Patent Publication No. 136790/1998, a cultivating shelf is disclosed. The shelf employs a fixed shelf frame, a cultivating vessel placed on the shelf frame, and a light source equipped with light-emitting diodes etc. located over the each vessel. Further, in the Japanese Unexamined Patent Publication No. 106757/2000, another plant cultivating device is disclosed. The device employs a plurality of conveyors above and below, up and down mechanism for supply and retrieval located at each input side and output side of the conveyor.

The multistory work bench type plant cultivating device has complicated drive mechanisms and requires complex supporting methods. Since the trays are aligned with relatively large intervals, the spaces between trays are useless when the plants are in their stage of being seeds or seedling. The useless spaces require longer water-supply pipes and also cause low illumination efficiency due to longer intervals between the light sources. In the cultivating shelf, it is possible to move the vessel to a larger shelf depending on the growth of the plants, but it involves great difficulties. In the Japanese Unexamined Patent Publication No. 106757/2000, a particularly large space is required in the grown stage of the plants causing insufficient efficiency of the illumination.

It is known in the field of hothouse cultivation of vegetables to employ lighting devices such as fluorescent lamps for illuminating the plants in order to get the effects similar to prolonged daylights. Particularly in industrial cultivation of vegetables, the cultivating vessels are placed on the several tiered shelf and illuminated by lighting devices to secure sufficient cultivating area.

In this case, it is disclosed to use a lighting-emitting panel on which a number of light-emitting diodes (LED) are arranged as a lighting device for the illumination of plants (for reference: the Japanese Unexamined Patent Publication No. 275779/1997 etc.). Such a lighting panel comprises a circuit pattern formed on a aluminum board, and a number of LED arranged on the circuit pattern, the LED being enclosed on the pattern using a translucent synthetic resin, wherein a reflecting plate is sometimes inserted between the LED and the board in order to increase light volume.

Conventional lighting devices such as fluorescent lamps consume a large amount of electric power causing high electricity charges, and their large amount of heat emission requires a measurable amount of power consumption in the air conditioners. On the other hand, the lighting panel using LED has a problem that it has no advantage over the fluorescent lamps in the durability because of probable degradation in high environmental humidity. Further, it has other problems that in the case of using large number of LED the manufacturing process takes a great deal of labor, and that the light volume of the panel is insufficient. The process is as follows: a LED is soldered on the circuit pattern formed on the base, an electrode is soldered on the circuit pattern, the LED and the electrode are bonded using a gold wire, and then a metal mold is mounted on the circuit pattern into which melted translucent synthetic resin such as epoxy resin is poured to enclose them within the mold. In the case that a reflecting plate is employed, the LED is soldered on the dish reflecting plate first, and then soldered on the circuit pattern of the base, wire bonded, and finally enclosed with the resin.

The present invention is directed to save the useless space and to increase the lighting efficiency of the conventional plant cultivating devices, and also directed to provide a lighting panel having the feature of low electric power consumption, low heat emission, and high durability. In addition, another object of the invention is to provide a lighting panel having large light volume and easy to manufacture.

DESCRIPTION OF THE INVENTION

The first aspect of this invention is the cultivating method provided by setting seedlings in a tray filled with culture solution; carrying the trays by mean of a conveyor device; illuminating the seedlings by light-emitting panel with large number of light-emitting diode set in a slant over the conveyor device so as to be gradually apart from the conveyor device along with the upstream side to downstream side of the conveyor device; and at the same time, circulating cooling water in the piping located at the rear surface of the light-emitting panel.

The second aspect of the cultivating method is provided by soaking roots of seedlings in a tray filled with culture solution; providing a transparent or half-transparent funnel-shaped holder on the upper surface of the tray for holding the upper part of the plants; carrying the trays by a conveyor device; and illuminating the plants by a lighting device, which is located over the conveyor device.

The present invention of the cultivating device comprises a conveyor device to carry plants; a lighting-emitting panel with a large number of light-emitting diode set in a slant over the conveyor device; and a piping to circulate a cooling water is located rear surface of the light-emitting panel; wherein the lighting device is disposed so as to be gradually apart from the conveyor device along with the upstream side to downstream side of the conveyor device. And it is preferable that the culture solution being in its temperature of 10 to 20° C.; and the tray being made of aluminum or aluminum alloy.

The second aspect of the cultivating device comprises a tray to hold the stub of plants, in which the root of seedlings is soaked in filled culture solution; a conveyor device to carry the trays; a lighting device located over the conveyor device; and a transparent or half transparent funnel-shaped holder on the upper surface of the tray for holding the upper part of the plant.

The third aspect of a cultivating device comprises a tray to hold the stub of plants, in which the root of seedlings is soaked in filled culture solution; a conveyor device to carry the trays; a lighting device located over the conveyor device; an up and down conveyor for supply and retrieval respectively located apart from the each end of the conveyor device; a partitioning provided between these conveyors and the conveyor device; and a transfer bar for transferring trays between the conveyor device and the up and down conveyors, the said bar being movable in both ways along the extension line of the conveyor device; wherein the partitioning has a opening for enabling the transfer bar to go in and out along the extension line of the conveyor device.

In this cultivating device, it is preferable to provide a door so as to be capable of to close and to open the opening located on the partitioning.

And also, it is preferable to provide a reflecting surface to reflect the light from the lighting device inside of the partitioning and the door.

Further, it is preferable in this invention to provide an up and down conveyor with an up and down arm to hold the tray, the arm being equipped with a horizontal portion extended toward the conveyor device and also equipped with a finger extended downward from the front end of the horizontal portion and further extending in the direction opposite to the conveyor device.

The forth aspect of a cultivating device comprises a tray to hold the stub of plants, in which the root of seedlings is soaked in filled culture solution; a conveyor device to carry the trays; a lighting device located over the conveyor device; an up and down conveyor for supply and retrieval respectively located apart from the each end of the conveyor device; a wall to surround the conveyor device; a transfer bar for transferring trays between the conveyor device and the up and down conveyors, the said bar being movable in both ways along the extension line of the conveyor device; wherein the partitioning has a opening for enabling the transfer bar to go in and out along the extension line of the conveyor device.

According to the present invention, the plants being carried by the conveyor grows under the illumination by a light-emitting panel, and become higher as they move to the down stream side of the conveyor. In the first aspect of the cultivating method, since the light-emitting panel is disposed in a slant so as to be gradually apart from the conveyor device along with the upstream side to downstream side of the conveyor, the distance between the light-emitting panel and the upper end of the seedlings is kept about the same, thereby enabling nearby illumination of the plants to get higher illumination efficiency. Luminous efficiency of light-emitting diodes is degraded by temperature rise due to the light-emission. This method cools the light-emitting panel due to the light-emission of the light-emitting diodes.

The first aspect of the plant cultivating device is preferable to the above cultivating method. And by maintaining the temperature of the culture solution around 10 to 20 degrees Celsius, it prevents plants from hazards of excess growth etc. Further, because the tray is made of aluminum or aluminum alloy, it can cool the surrounding air, thereby avoid the temperature rise due to the light emission of the light-emitting diodes and maintain the surrounding in preferable temperature.

In the second cultivating method, the upper part of the stub of plants is held by a transparent or half transparent funnel-shaped holder located at the upper surface of the tray, thereby the green vegetables such as lettuces being bundled upward. Therefore, even in the smaller intervals between the adjacent plants, the leaves do not intertwine, and the upward-directed leaves are illuminated sufficiently by the lighting devices, whereby the many stubs of plants can be accommodated in a tray with efficient illumination by the lighting devices.

Because the leaves of plants are bundled upward with the funnel-shaped holder, the height of plants becomes higher. For that reason, it is preferable for the second cultivating method to be combined with the first cultivating method so as to illuminate the plants from a higher position.

The second aspect of a cultivating device can carry out the second cultivating method efficiently.

In the third aspect of a cultivating device, a partitioning is provided between the conveyor device and the up and down conveyor, whereby the partitioning prevents the light of the lighting device from spreading outside and make easy to control the temperature inside. Handling of trays between the conveyor device and the up and down conveyor is easily done through the opening provided on the partitioning. In the case that a door is provided so as to be capable of closing and opening the opening, the door closes the opening all times except when the trays are transferred through the window, shutting off the light of the lighting device at the window and enabling easier control of the temperature. In the case that a reflecting surface to reflect the light of the lighting device is provided inside of the partitioning and the door, the efficiency of the lighting is further increased.

Further, the transferring between the up and down conveyor and the transfer bar can be done through the opening preventing the interference between the door and the finger. Further, the opening and closing movement of the door is connected with the forward and backward movement of the transferring bar so as to simplify the drive and control mechanism.

In the fourth aspect of the cultivating device, the wall is placed surrounding the conveyor device, and wall reflects the light of the lighting device, so it prevents from spreading of the light from lighting device.

A lighting-emitting panel of this invention comprises a base plate, a circuit board mounted on the base plate, a light-emitting unit provided with a number of lamps arranged and fixed on the circuit pattern of the circuit board, a translucent cover placed with a space adjacent to the base plate, a sealing material sandwiched between the base plate and the cover to keep the space airtight, and the lamps being fixed on the circuit board using a conductive adhesive.

In these light-emitting panel, it is preferable that a frame is sandwiched between the base and the cover, wherein a sealing material is packed around the frame, the space is filled with inactive dry gas, and a desiccant and/or deoxidizer is accommodated inside of the frame.

Further, it is preferable that the lamp is provided with a concave reflecting plate, a light-emitting element mounted on the reflecting plate, a bonding wire to bond the light-emitting element and an electrode, and a translucent molding material of synthetic resin to enclose the above described part, and that the conductive adhesive is composed of soldering cream a kind of heat setting adhesive.

The light-emitting unit of this invention comprises a circuit board having a circuit pattern, a number of lamps arranged and fixed with a conductive adhesive, wherein the lamps are enclosed in a package together with a reflecting plate, a light-emitting element, a bonding wire, and an electrode using a translucent molding material.

In this light-emitting unit, it is preferable that the circuit board is made of aluminum, forms an insulation layer on the circuit board of aluminum, wherein a circuit pattern is formed on the insulation board. And further it is preferable that a layer of soldering cream is formed on the circuit pattern, wherein the layer is heated after mounting of the lamps so as to be melted and then be cooled down naturally for solidifying, thereby fixing the lamps on the circuit pattern. In addition, the base can be served as a circuit board.

The light-emitting panel of this invention employs light-emitting elements as a light source, it consumes relatively small amount of electric power compared with conventional light sources as fluorescent lamps, and it has small amount of heat emission which reduces the power required for the air conditioning. Further, the selection of a light-emitting element having a specific wavelength allows composition of a light-emitting panel well suited for any object.

The light-emitting panel provided with light-emitting elements is accommodated in a space between the base and the translucent cover. Since the space is made airtight with a sealing material, it shuts off the humidity incoming from the outside and decreases degradation of the light-emitting elements due to the humidity achieving high durability.

Because the space is hermetically sealed, heat coming up with the light-emission is inclined to be accumulated in the space. However, the heat is radiated outside through the base plate keeping the heat accumulation relatively low. Furthermore, since the lamps manufactured separately are mounted and fixed to the circuit board with adhesive, in the case of using many lamps, it is easy to control the quality of the whole manufacturing process and each lamp.

The light-emitting panel with its frame sandwiched between the base and the cover, a sealing material being packed around the frame, the space being filled with dry gas, and a desiccant and/or a deoxidizer being accommodated in the frame, has accurate spacing between the base plate and the cover and has large unit strength. Further, because the sealing material is needed only to seal the gap between the frame, the base plate, and the cover, it has large efficacy in sealing. Furthermore, by the effect of the desiccant and the deoxidizer, the amount of humidity and/or oxygen contained in the space is very low, thereby the light-emitting elements such as light-emitting diodes being protected against the degradation due to humidity and/or oxygen.

In the case that the lamp is provided with a concave reflecting plate, a light-emitting element mounted on the reflecting plate, a bonding wire to bond the light-emitting element and an electrode, and a translucent molding material of synthetic resin to enclose the above described part, a relatively large amount of light is obtained by the reflection of light from the light-emitting element. Further, since the light-emitting element, an electrode, and a bonding wire are enclosed in a package using a molding material, a number of lamps are easily handled in an automatic mounting process of the light-emitting panel manufacturing, thereby the panels being manufactured efficiently.

In the case that, as the conductive adhesive, soldering cream a kind of heat setting adhesive is used, a large number of lamps can be fixed on the circuit board at a time only by a heating process after mounting of the lamps on the circuit board.

In the light-emitting unit of this invention, the employment of the lamp in which a reflecting plate, a light-emitting element, a bonding wire, and an electrode are enclosed using a translucent molding material; allows easy handling of a number of the lamps. In the case that the insulation layer is formed on the circuit board of aluminum and a circuit pattern is formed on the insulation layer, the circuit board weighs light enabling easy manufacturing. Moreover, in the case that the base plate can be served as a circuit board, number of necessary parts becomes fewer enabling the further easy manufacturing.

BRIEF DESCRIPTION OF THE DRAWINGS

FIG. 3 is a plan view of the cultivating device;

DESCRIPTION OF PREFERRED EMBODIMENTS

Figure 2:
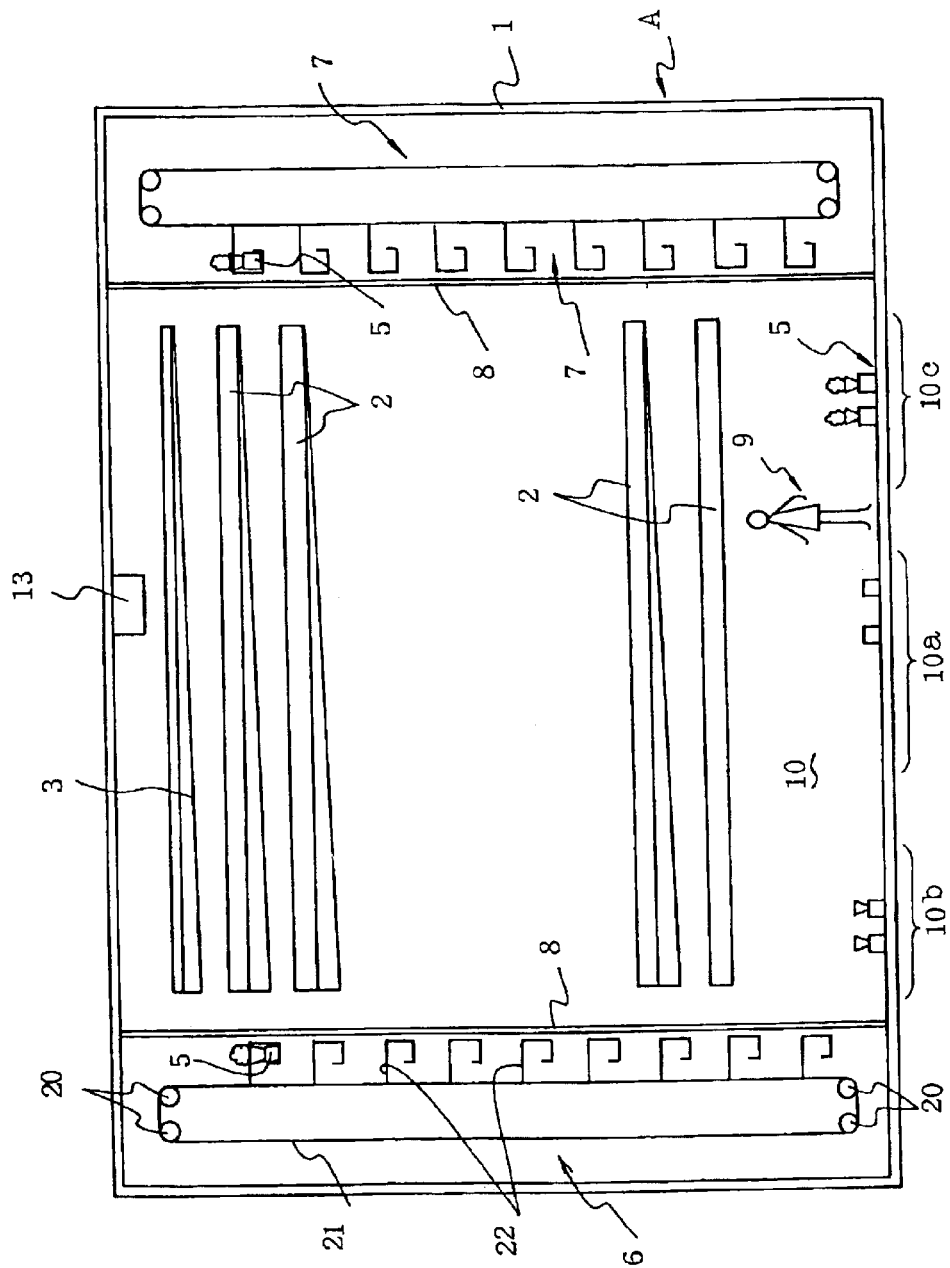
FIG. 2 is a side view of a cultivating device of this invention showing the device wholly.

The plant cultivating device is wholly described herein referring to FIG. 2 and FIG. 3. A plant cultivating device A shown in FIG. 2 and FIG. 3 comprises multistage conveyor device 2, 2 . . . assembled in a building 1, a lighting device 3 fit under each conveyor device 2, a fix planting conveyor 6 to supply a tray 5, a harvesting conveyor 7 to retrieve the tray to conveyor device 2. The fix planting conveyor 6 and the harvesting conveyor 7 move up and down respectively. Further, the plant cultivating device comprises pipes for cooling water to cool the lighting device 3, a water supply facility to supply solution to the tray 5 on the conveyor device 2 for hydroponics, and incidental facilities such as drainage facility to drain water from the tray 5. In this embodiment, each stage of the conveyor device 2 has practically the same composition, wherein the same or different plants can be cultivated in the each stage.

The size of the building 1 is, for example, 10 m high, 12 m long, and 10 m width with heat-insulated wall of 10 cm thickness, wherein the size is changeable according to the kind of plants to be cultivated.

Further, in this embodiment, reflecting walls 8 (partitioning) to reflect lights from the lighting device 3 are provided between the fix planting conveyor 6 and the conveyor device 2, and between the conveyor device 2 and the harvesting conveyor 7. The reflecting wall 8 can be provided so as to surround the conveyor device 2. A heat insulation material can be used as the reflecting wall 8. For example, white foam polystyrene has both effects. Light-reflective metal films such as aluminum films can be attached to inside of the reflecting wall 8 in order to reflect lights.

In the lower part of the building 1, a work room 10 is provided for workers 9 to put the tray 5 on the fix planting conveyor 6 and to retrieve the tray from the harvesting conveyor 7. Over the work room, the conveyor device 2 of, for example, about 10 stages is provided. The central part of the work room 10 is a seeding area 10a, the near part of the fix planting conveyor 6 is a breeding area 10b, and the near part of the harvesting conveyor 7 is a harvesting area 10c to harvest plants by unloading the trays 5 from the conveyor device 2.

As shown in FIG. 3, the every stage of the conveyor device 2 is located at right and left side of the building 1, wherein the conveyor device 2 supports the tray 5 at somewhat inside from the right and left end of the tray 5 which is long in the crosswise direction.

Moreover, a plurality of the rail 11 is provided between the near part of the right and left end of the conveyor device 2, and between the conveyor device 2 to slidably support the tray 5.

Figure 1:
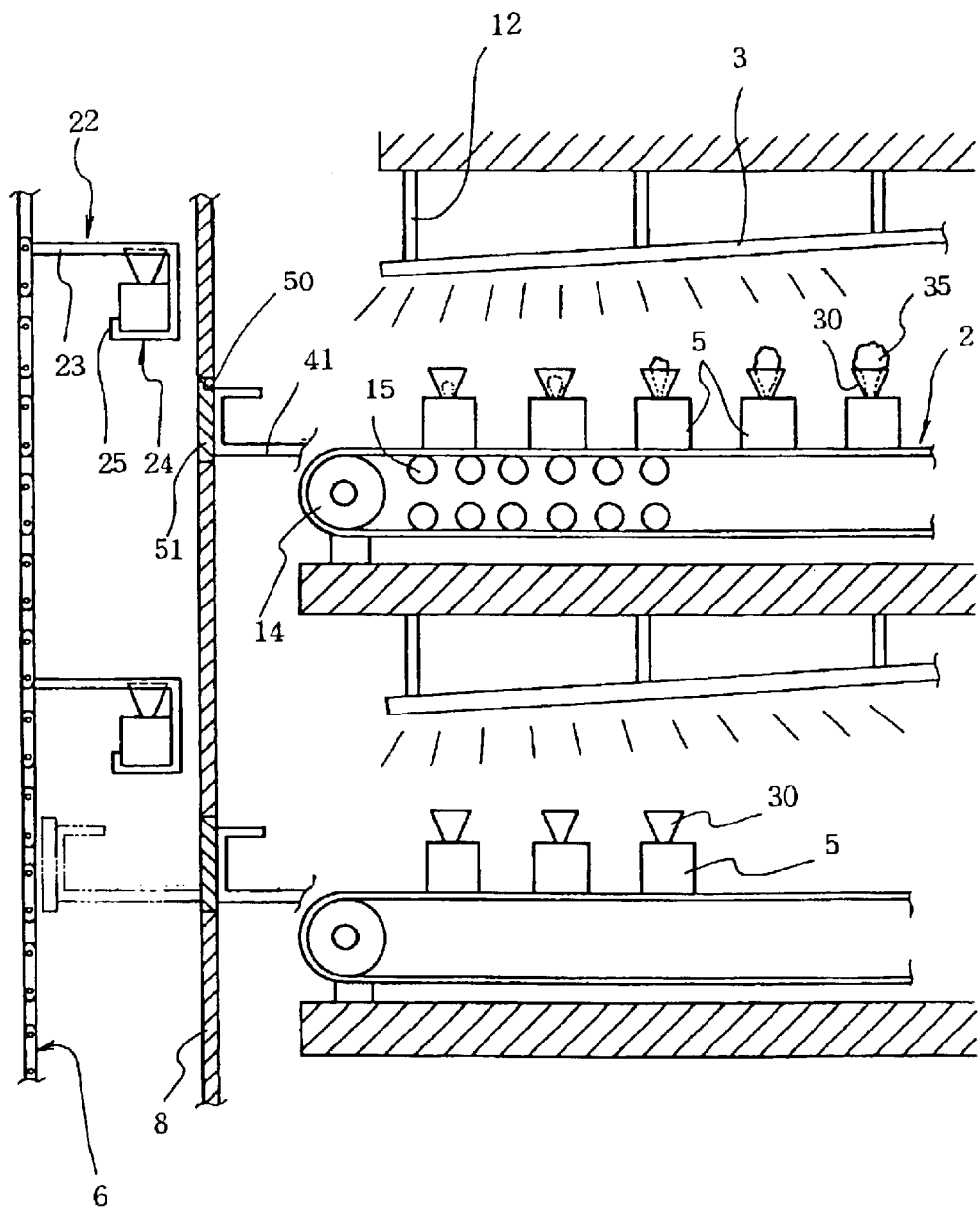
FIG. 1 is a rough cross sectional view of the cultivating device of this invention.

As shown in FIG. 1 and FIG. 2, the lighting device 3 having a plane surface is supported by a stay 12 under the bottom of the conveyor device 2 with some space in between, wherein the lighting device 3 is disposed so as to be lower in the upstream side and higher in the down stream side illuminating the tray 5 of one stage under.

The reason for the lighting device 3 is inclined is that, in early stage of the plant growth, it is necessary to bring the lighting device 3 near to the plants in order to illuminate the plants because of the relatively lower height of the plants.

Under the bottom of the lowest stage conveyor device 2, the lighting device 3 is omitted, but a lighting device 3 to illuminate the tray 5 on the highest conveyor device 2 is provided near the ceiling of the building.

As the lighting device 3 a fluorescent lamp or an electric lamp is usable, but a light-emitting diode (LED) which emits a light whose wave length is optimum for the plant cultivation is preferable.

In the case that a number of light-emitting diode is used in a panel like arrangement, as the lighting device 3, selection of different color diodes depending on the kind of plants is possible. For example, two third of each light-emitting panel is occupied by red color light-emitting diodes, one third is by blue color light-emitting diodes. The total luminous intensity of the light-emitting panel is preferable to be from 2000 to 3000 lux. However, it can be set at preferred intensity depending on the plants to be illuminated, and also the intensity can be arbitrarily time controlled.

The Reference Numeral 13 in FIG. 2 shows a fan to circulate air in the building 1 which is provided with an air conditioner for temperature, humidity, and $CO_2$ control. In the case that the environment of the plant growth is preferred to be changed in the midway of the conveyor device 2, a translucent synthetic resin sheet can be used as a partition.

In addition, it is preferable to automatically control the various environmental factors by continuous monitoring of the gas density, temperature, and humidity with each sensor.

The conveyor device 2 is described herein referring to FIG. 1 and FIG. 3.

The conveyor device 2 located at right and left side can be composed of one belt conveyor each. The belt conveyor comprises a rotary drive drum 14 located at the end, a large number of an idler 15 between the drum 14, a belt 16 circulating around them, and a motor (Reference Numeral M in FIG. 5) to drive the drum 14. The drive drum 14 of the right and left conveyor device 2 is coupled each other by a drive axis (Reference Numeral 17 in FIG. 5). Such a circulating conveyor device as a chain conveyor can be used in lieu of the belt conveyor. The conveyor device can be composed of a chain of a plurality of small independent conveyors from the fix planting conveyor 6 to the harvesting conveyor 7, wherein the carrying speed of the every conveyor can be varied each other.

As shown in FIG. 2, the fix planting conveyor 6 is constructed so that four sprockets 20 located at the upper and lower end hold the endless chain 21, which is like a chain conveyor set in a vertical direction. The chain 21 is provided with a receptacle 22 to hold the tray 5 at an interval fitted to that of the conveyor device 2. In addition, as shown in FIG. 1, the receptacle 22 has, in relation to the transfer mechanism described later, horizontal portion 23 extending forward and L-shape finger 24 which extends downward from the front edge of portion 23 and further extends backward from the lower end. On the edge of the finger 24, a hook 25 is provided.

The chain 21 is driven circularly by a motor (not shown in the figure.) so that the front side goes up with the back side going down. Since the harvesting conveyor 7 is substantially the same as the fix planting conveyor 6, descriptions are abbreviated by assigning the same reference numerals to the same portions.

Figure 4A:
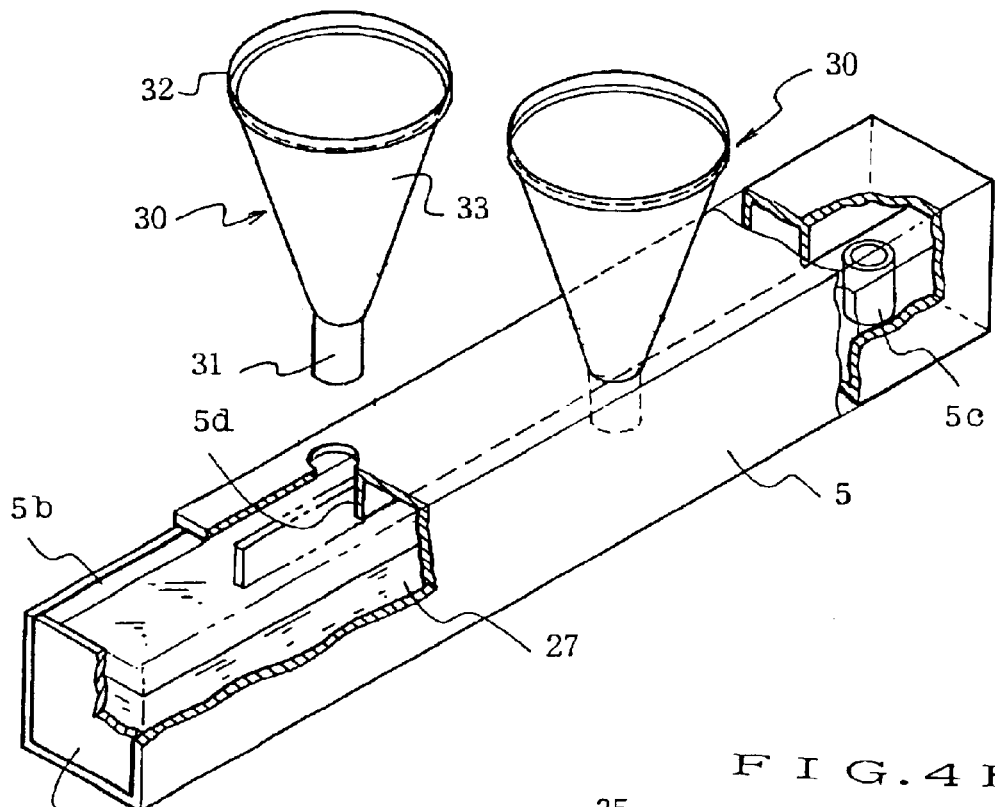
FIG. 4A is a perspective view with a fragmentary sectional view showing an embodiment of a tray of the cultivating device.

FIG. 4A shows a preferable embodiment of the tray 5. The tray 5 is made of aluminum or aluminum alloy with its both ends closed by a cover 5a etc. The upper surface is provided with openings for cultivating plants at an interval of 50~300 mm. Like showed in FIG. 4B, the tray 5 has a liquid filled structure contains culture solution 27. On the one end of the upper surface of the tray 5, there is a opening 5b for supplying culture solution, and on the bottom of the another end, there is a drain pipe 5c passing through the bottom for draining culture solution. The height of the drain pipe defines the upper limit of the solution level, thereby culture solution exceeding the level being drained through the drain pipe 5c. The temperature of the culture solution is maintained in temperature around 10~20° C. usually, or more preferably in temperature around 15~16° C. Since the tray 5 is made of aluminum or aluminum alloy, it can cool the surrounding air, thereby preventing plants from hazards of excess growth etc. by withholding temperature rise caused by the room temperature of 22~23° C. or the lighting devices 3 in not only the root of but also stems and leaves of plants.

In this embodiment, the opening 26 of the tray 5 is circular in which a funnel-shaped holder 30 is mounted. On the upper inside of the central part of the tray 5, there is a rib 5d projecting downward, and the opening 26 is located zigzag avoiding the rib 5d. The holder 30 is composed of a cylindrical base 31 set in the opening 26 and of the conical holding part 33 extending upward from the base 31.

Figure 4B:
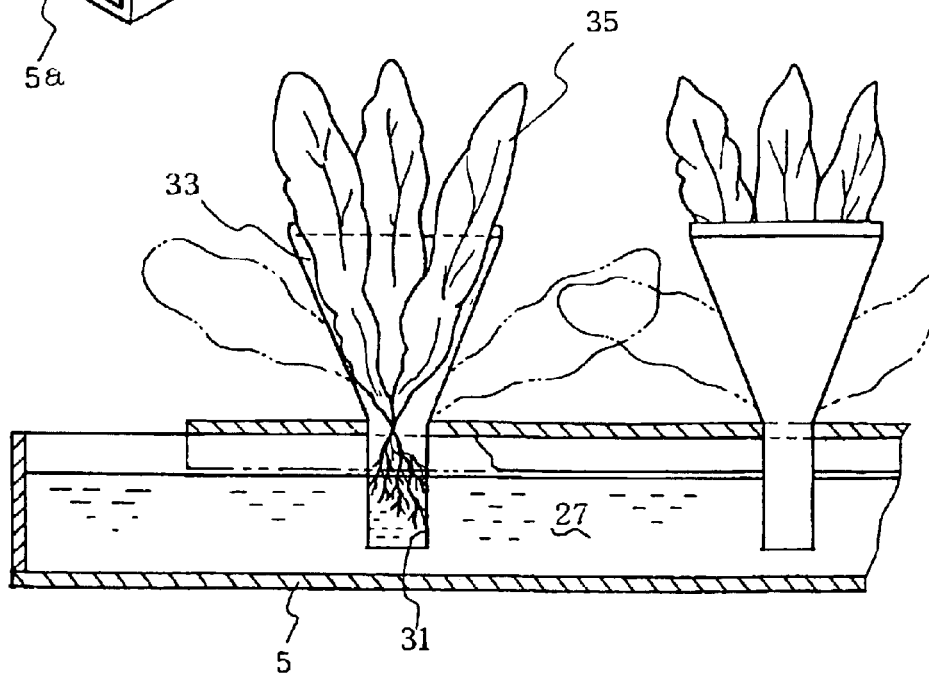
FIG. 4B is a cross sectional view of the main part of the tray.

The upper edge of the holding part 33 has a fold 32 to reinforce the holding part 33. The holding part 33 has no preference of cylinder type or square type. The tray 5 can be wholly molded integrally using synthetic resin etc. For example, it can be manufactured as follows; a synthetic resin sheet is molded into the holing part 33 and the bottomed base 31 by hot pressing; the outskirt of the fold 32 is finished by trimming; and the bottom of the base 31 is punched out. It is preferable for the holding part 33 to be transparent or half transparent so as to let through lights. When the holder 30 is set in the opening 26 as shown in FIG. 4B, the base 31 touches the inside wall of the tray 5 or the rib 5d preventing the holder 30 from falling down. However, it is allowable to provide a collar on the boundary of the base 31 and the holding part 33.

The use of such holder 30 enables to hold the leaves of plants 35 such as green vegetables called "sunny lettuces" without spreading.

When the plants 35 are planted directly in the opening 26, the leaves of the plants 35 spread in the lateral direction with their growth as shown by the imaginary line. When the leaves spread wide as shown in the figure, they interfere each other with the leaves of the adjacent plant 35 and sometimes ripped in harvesting. Furthermore they become poorly illuminated due to shadowing by the leaves of adjacent plants, thereby necessitating larger interval of the opening 26.

However, as shown in FIG. 4A and FIG. 4B the tray 5 has the holding part which bundles the leaves of plants upward, thereby preventing the leaves from spreading as shown by the imaginary line and avoiding interference of the adjacent leaves each other. Resultantly, the interval of the openings can be reduced to about 50~200 mm, which increases gather per unit area. Furthermore, the plants can be fully illuminated by the lighting devices.

Figure 5:
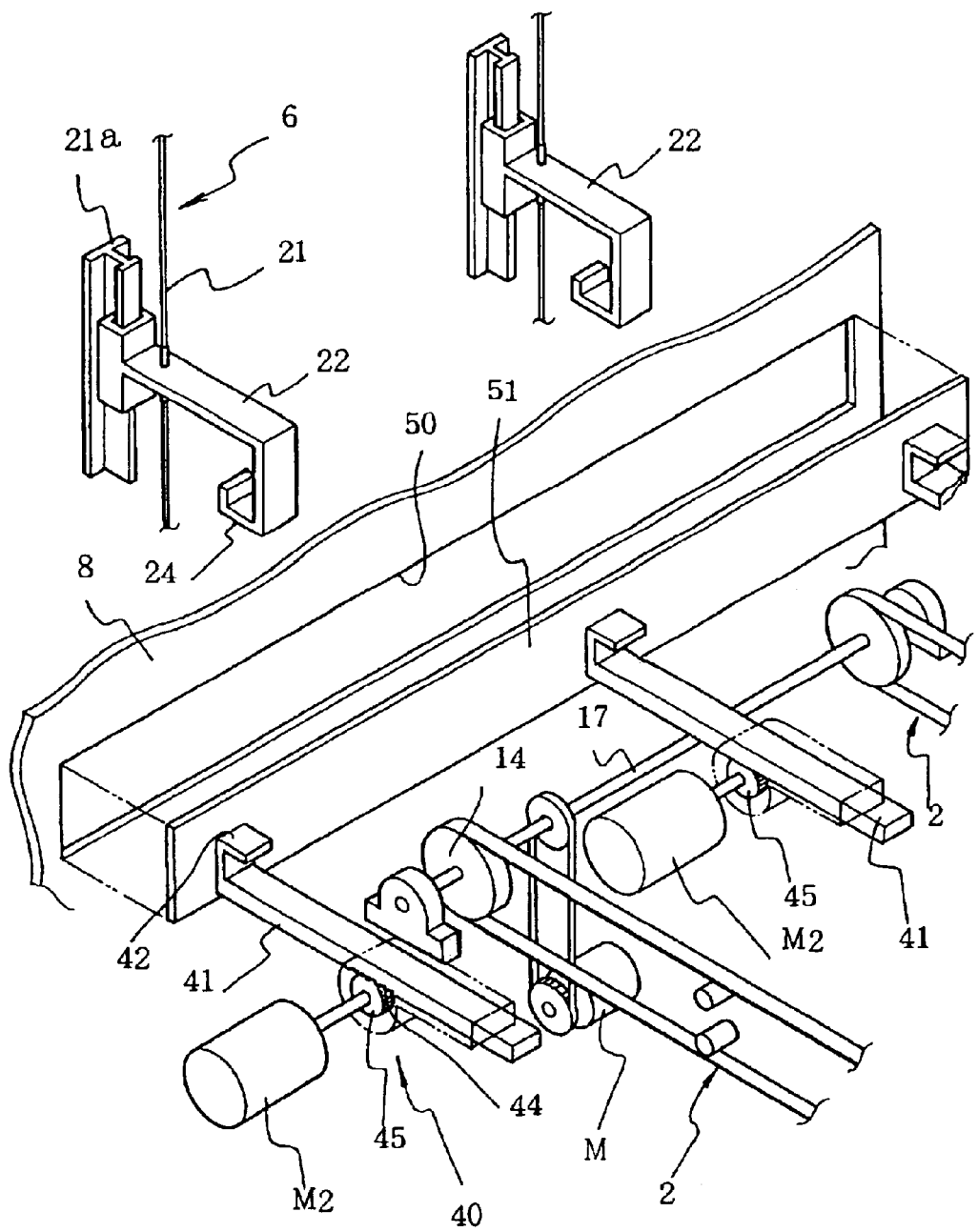
FIG. 5 is a perspective view of an embodiment of a transfer mechanism of the cultivating device of this invention.

The fix planting conveyor 6 is located so as to avoid interference with the carrying conveyor device 2. For this reason, as shown in FIG. 5, a transferring mechanism 40 for transferring the tray 5 between these two conveyors are provided. The transferring mechanism 40 is a combination of transfer bar 41 moving back and forth and the fix planting conveyor 6 moving up and down. The transfer bar 41 is, for example, a flat board or a pipe with an upward hook 42 on its front edge for holding the tray 5 stably. The transfer bar 41 is supported by a guide 43 so as to be movable back and forth, and is driven back and forth by a underneath rack 44 and a pinion 45 driven by a motor M2.

Multiple, for example two to three, transfer bar 41 are provided in parallel for enabling stable transfer of the tray 5 which is long from side to side. The pinions 45 driving the transfer bar 41 are driven by each motor M2 synchronously, thereby being capable of synchronous operation. In addition, other types of direct drive actuators such as air cylinders or hydraulic cylinders can be used as the driving device, but the motor drives are preferable.

As described previously, the reflecting wall 8 is provided between the fix planting conveyor 6 and the carrying conveyor device 2. The reflecting wall 8 has a opening 50 or a window for enabling the transfer bar 41 to go through. In this embodiment, a door 51 is provided on the front edge of the transfer bar 41 to close the opening 50. The door 51 can be composed of white foam polystyrene which is the same as the reflecting wall, or can be composed of aluminum foil attached on the inner surface.

Figure 6:
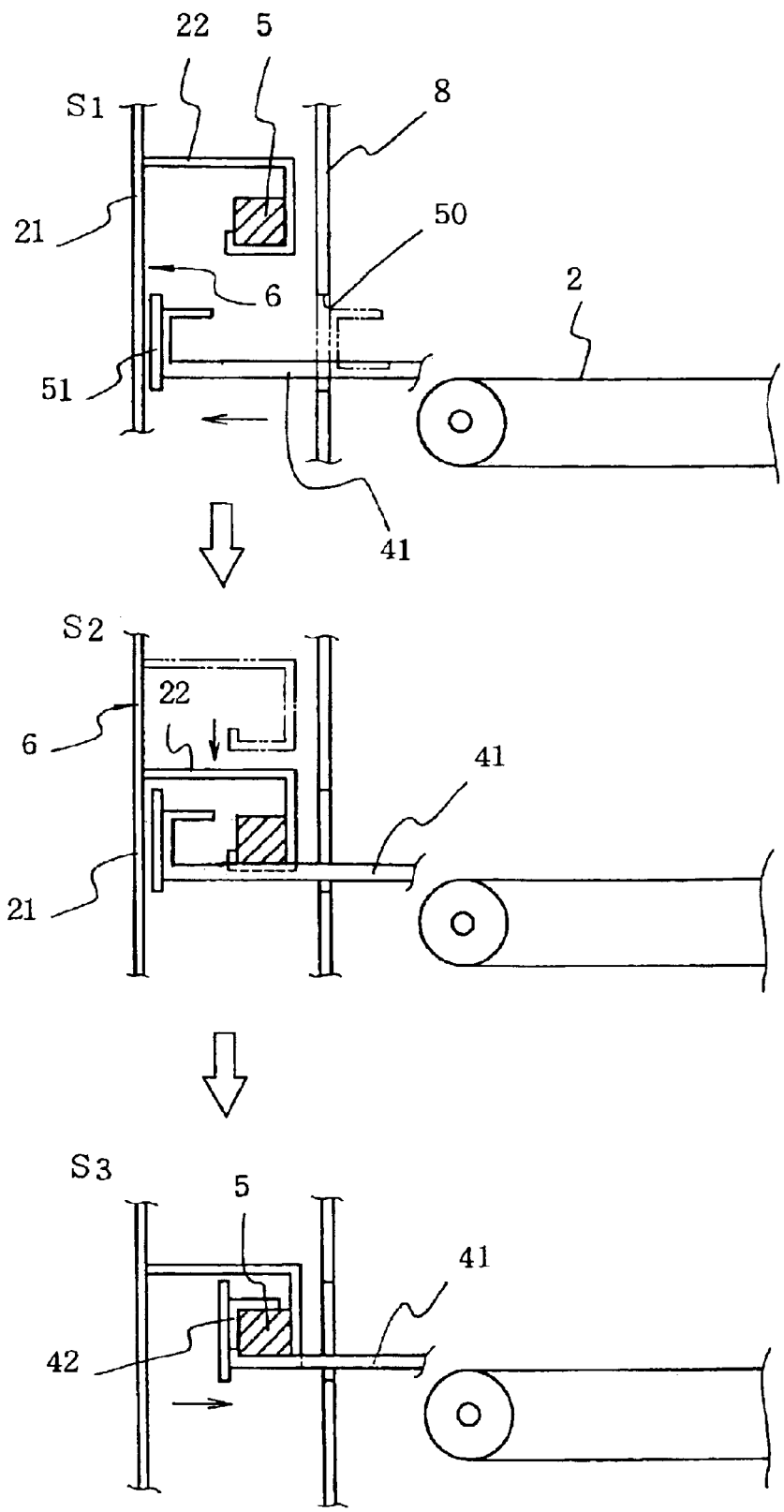
FIGS. 6 and 7 are process drawings of the transfer mechanism.

Since the location of the receptacle 22 of the fix planting conveyor 6 and the transfer bar 41 can be staggered from side to side, originally the tray 5 can be transferred to the transfer bar 41 when the transfer bar 41 goes ahead and the fix planting conveyor 6 goes down. However, in this embodiment, because the door 51 is provided on the front edge of the transfer bar 41, it is necessary to avoid interference between the door 51 and the receptacle 22. As described previously, it is for this reason that the receptacle 22 is provided with the finger 24 which takes out the tray 5 backward. Followings are the description of the transferring procedures from the receptacle 22 to the transfer bar 41 referring to FIG. 1, FIG. 6 and FIG. 7. The motor of the fix planting conveyor 6 and the motor M2 of the transfer bar 41 are controlled so that the following procedures are carried out in the sequence.

At the start, as shown in FIG. 1, the receptacle 22 is standing at the position where it does not interfere with the door 51 and upper than the opening 50 of the reflecting wall 8. In this condition, as shown in the upper part of FIG. 6, the transfer bar 41 is moved toward the fix planting conveyor 6 and the hook 42 is positioned at the back of the tray 5(Step 1). Then the fix planting conveyor 6 is driven to lower the receptacle 22 and the tray 5 is put down lightly on the transfer bar 41 (Step 2). Subsequently, the transfer bar 41 is moved backward to be able to hold the tray 5 with the hook 42 (Step 3).

Figure 7:
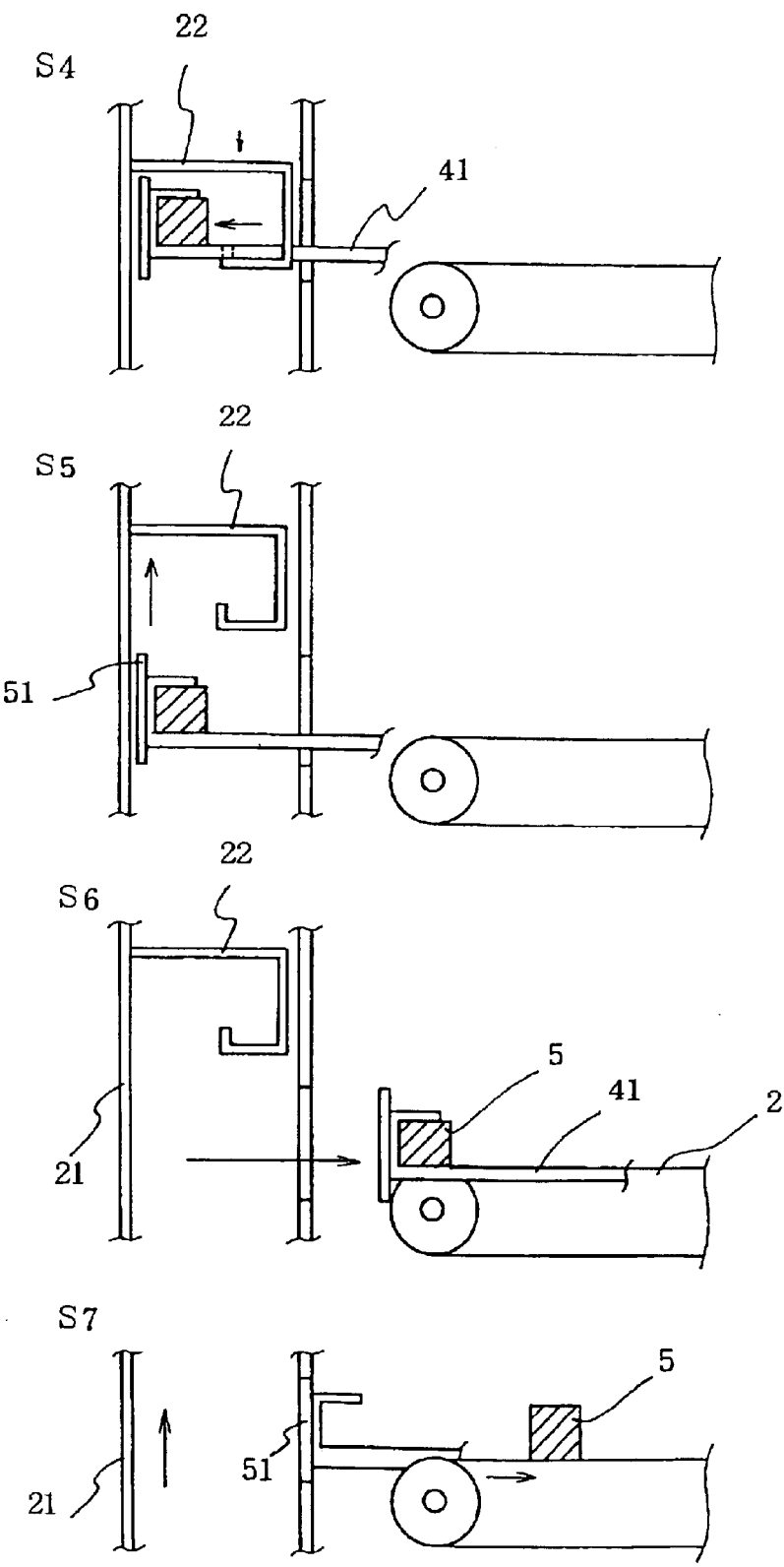

Continuously, as shown in the upper part of FIG. 7, the receptacle 22 is slightly lowered and the transfer bar is again moved forward (step 4). Next, in this condition the receptacle 22 is elevated to the position where it does not interfere with the door 51 (Step 5). Further, the transfer bar 41 is moved backward to transfer the tray 5 to the conveyor 5. After that, the transfer bar is moved backward to close the opening 50 of the reflecting wall 8 with the door 51.

Operation of the receptacle 22 and the transfer bar 41 in the sequence described above prevents the interference between the door 51, the tray 5 and the receptacle 22.

The provision of the door 51 allows automatic close of the opening 50 without provision of other drive sources, and also allows to secure reflection and thermal insulation of the reflecting wall 8.

Other driving source such as motors or air cylinders can be used with upper part of the door 51 being hinge-jointed to the reflecting wall 8. In this case, the receptacle 22 can be provided only with an upward projection for hooking the tray 5 on the front edge of the horizontal portion 23. And, after the tray 5 is transferred to the transfer bar 41 by lowering the receptacle 22, it is not necessary for the receptacle 22 to be elevated, and only necessary to make an escape downward.

The tray 5 can be transferred to the conveyor all together from the receptacle 42 of each stage of the fix planting conveyor 6, or can be transferred with respect to each stage of the fix planting conveyor 6. The emptied fix planting conveyor 6 is loaded with the next planted tray 5 by a worker 9 as shown in FIG. 2.

As the fix planting conveyor 6 and the transfer mechanism 40, not limited to the above devices, various devices such as those used in multi story warehouses can be employed. For example, the transfer bar 41 described above can be such a device which goes up and down by itself to the chain. In this case, the slight lowering of the front side of the fix planting conveyor becomes unnecessary, and the transfer from the transfer bar 44 to the carrying conveyor 2 becomes smooth.

Figure 8:
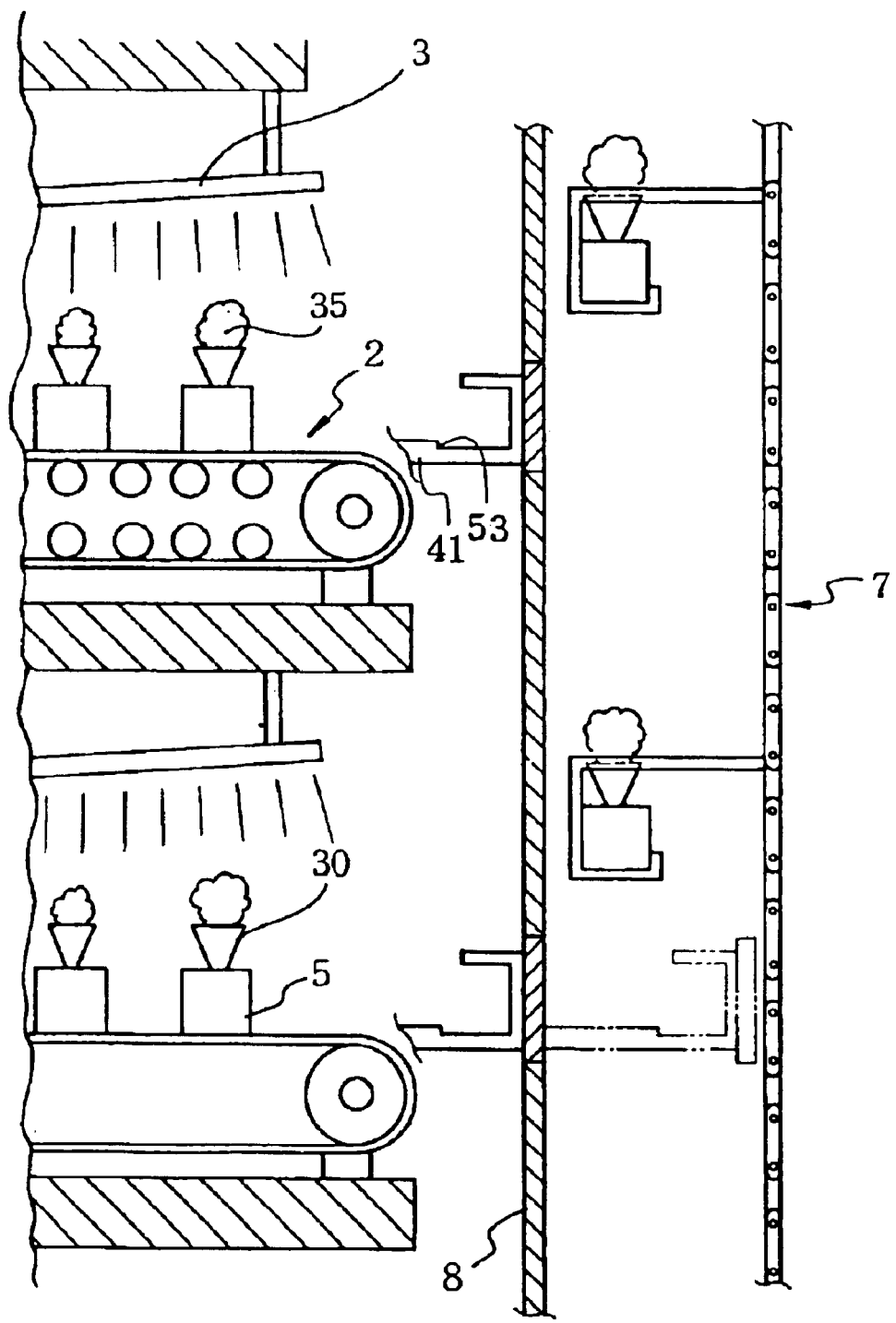
FIG. 8 is a rough cross sectional view showing an embodiment of the transfer mechanism in harvesting conveyor side.

As the harvesting conveyor 7 shown in FIG. 8, substantially the same device with the fix planting conveyor 6 can be employed, in which only the circulation and the sequence of operation is reversed.

However, when the tray 5 is taken out from the conveyor device 2, tangling of leaves of plants to those of the next tray sometimes occurs. It is preferable to provide a shoulder near the front edge of the transfer bar 41 for hooking the tray 5 so as to prevent the tangling.

The tray 5 retrieved from the harvesting conveyor 7 is brought down to a working area 10c by the worker and the plants only are harvested.

The emptied tray 5 is used again in a planting area 10a so as to be planted seeds. The tray 5 is generally filled with water, nutriment, substance retentive of water, and seeds only; in other words, cultivation by hydroponics. Soil can be put in the tray and seeds are planted in the soil. Seedlings can be planted in the tray from the first.

Next, a preferable embodiment of the lighting device 3 employing light-emitting diodes is described. Luminous efficiency of light emitting-diodes is degraded by temperature rise due to the light-emission. In addition, in the building 1, the indoor air is maintained at high temperature and humidity, causing further degradation of the luminous efficiency.

Figure 9A:
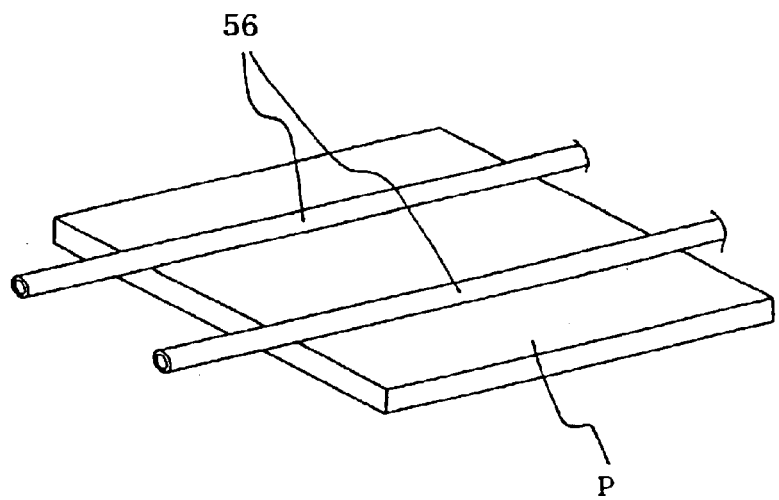
FIG. 9A is a perspective view showing an embodiment of a lighting device of this invention.

In this embodiment, as shown in FIG. 9A, the base plate of the lighting panel P, on which a number of light-emitting diode is mounted, is made from a metal plate such as aluminum having high thermal conductivity. The rear side of the light-emitting panel P is provided with a piping 56 to pass through cooling water. As for the metal plate, other plates such as ceramics having high heat conductivity can be used.

Figure 9B:
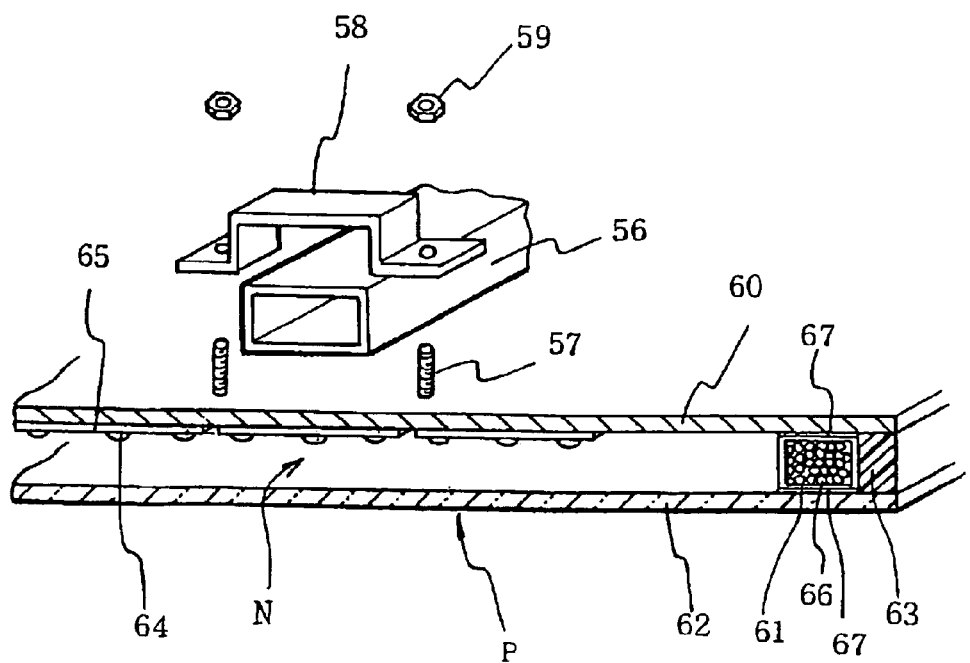
FIG. 9B is a cross sectional view of the main part of the lighting device.

In the light-emitting panel P of FIG. 9B, the piping 56 is made from rectangular pipes, wherein a stud bolt 57 is projected from the rear of the light-emitting panel P; and a folded metal mounting plate 58 and nuts 59 fix the piping 56. The use of such rectangular pipes is preferable because it enhances heat conduction.

Furthermore, the light-emitting panel P comprises a base plate 60 of aluminum etc., a frame 61 made from aluminum rectangular pipe etc. located at the bottom of the panel, a cover 62 laid on the undersurface of the frame 61, a sealing material 63 such as silicone resin packed around the periphery of the frame 61.

On the undersurface of the base plate 60, a circuit board 65 on which a number of lamps 64 having a light-emitting element such as a light-emitting diode is arranged. Inside of the frame 61, a desiccant 66 is accommodated. The space N between the base plate 60 and the cover 62 is filled with inactive gas such as nitrogen gas reducing the degradation due to oxidation of the light-emitting diode. Dry air can be used in place of the gas. The space N can be vacuumized to the degree of 0~0.3 atm. In this case, not only the degradation due to oxygen or humidity is reduced, but also the heat conduction due to convection from the cover 62 side is reduced. A sealing material such as butyl putty 67 is sandwiched between the frame 61 and base plate 60, the frame 61 and the cover 62 for maintaining the air-tightness of the space N together with the silicone resin sealing material 63.

As shown in FIG. 1 etc., the lighting-emitting panel P is set at a slant. Cooling water is circulated in the piping 56 located at the rear surface of the light-emitting panel P, and the piping 56 being also set at a slant for enhancing the circulation of the water.

In addition, the light-emitting panel P can be set in step-wise with its piping also being set in step-wise on the rear surface. As well, dry air in its temperature of about $-40°$ C.~$-80°$ C. can be fed in the piping 56 for cooling the lighting device 3 directly or indirectly through cooling plates. Hot air after cooling the lighting device 3 can be recovered by ducts directly or discharged into the room.

Further, a light source such as light-emitting diode can be enclosed in such as a heat-insulated box and cooled by cold dry air or cold water, wherein the light is guided by optic fivers from the light source to the undersurface of the conveyor device 2 (upper side of the tray). In this case, the light source can be cooled sufficiently and condensation can also be prevented resulting in protection of the light source. Furthermore, exterior natural light can be guided by optic fibers to the undersurface of the conveyor device 2 in the building.

Figure 10:
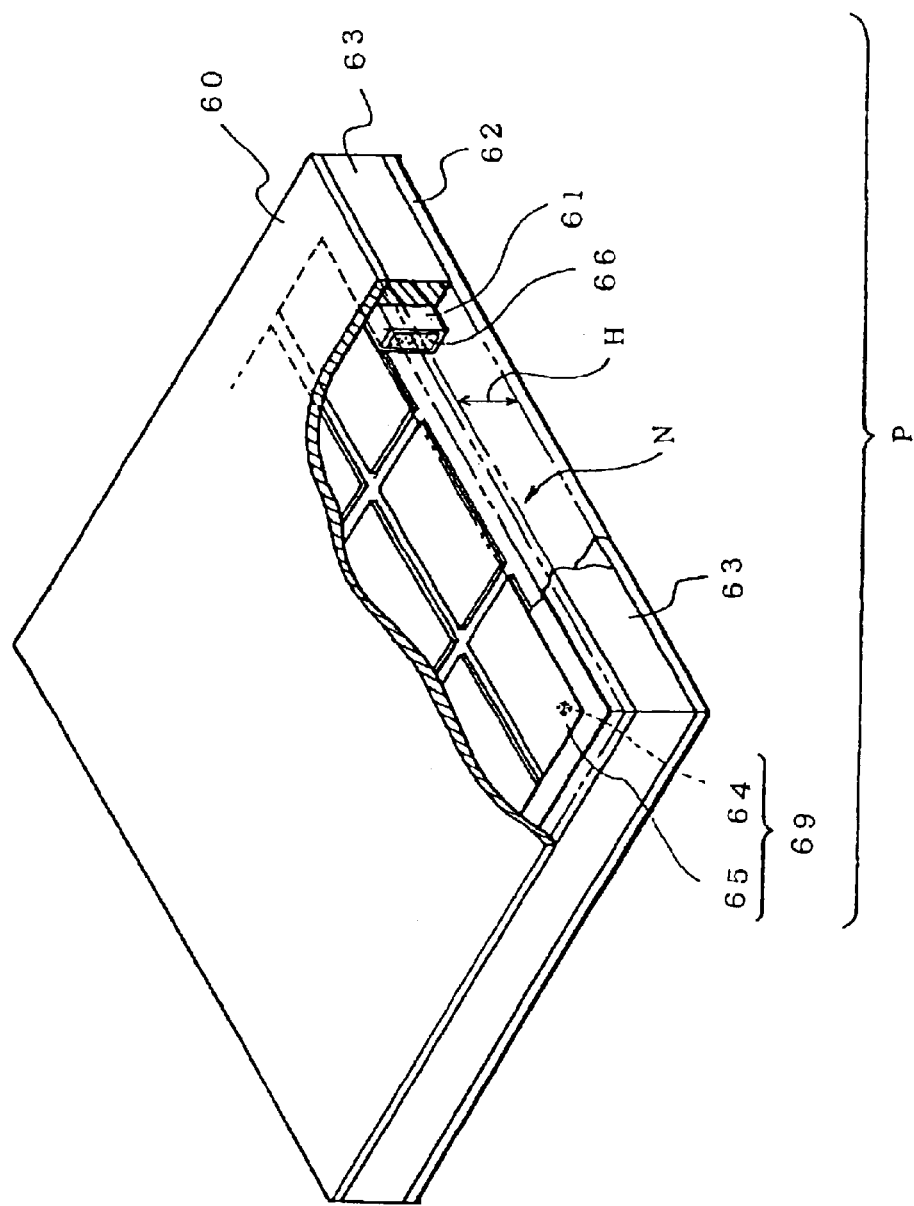
FIG. 10 is a perspective view with a fragmentary sectional view showing the other embodiment of a light-emitting panel wholly.

As shown in FIG. 10, the light-emitting panel P is basically the panel on which the above described board 65 and the light-emitting unit 69 composed of the lamp 64 are set in array; a plurality of the board and dozens or several hundred of the unit throughout the length and breadth of the panel respectively. The board 65 of the light-emitting unit 69 can be about the same in size as the base plate 60. Further, the base plate 60 can be served as the board 65 (refer to FIG. 22). Such light-emitting panel P is also used as a message board for spreading prescribed message by connecting the terminal of the circuit pattern to a computer controlled circuit and making light emission of many light-emitting diodes in sequence.

The use of light-emitting diodes whose color is red, green, violet etc. allows color screen image display. Since such light-emitting panels have large light volume, large message impress can be expected. Additionally, simplicity of the manufacturing process allows low cost manufacturing in the case that it is used in a large scale light-emitting panel of the size from scores of centimeter to about 5 m.

The kind of the light-emitting element used in this invention is not limited particularly, and generally light-emitting diodes are used. It is preferable to use red light of wave length 600 nm which has the highest efficiency in photosynthetic reaction in plants. The circuit pattern 70 can be formed by a wiring pattern connecting each light-emitting diode in series or in parallel or by a matrix wiring pattern. Discrete wiring by connecting each wire can also be done otherwise.

The wiring between the each board 65 is sealed off using a sealant described later after completion of the each wiring and drawing out of the wire from the corner of the light-emitting unit 69.

Figure 11A:
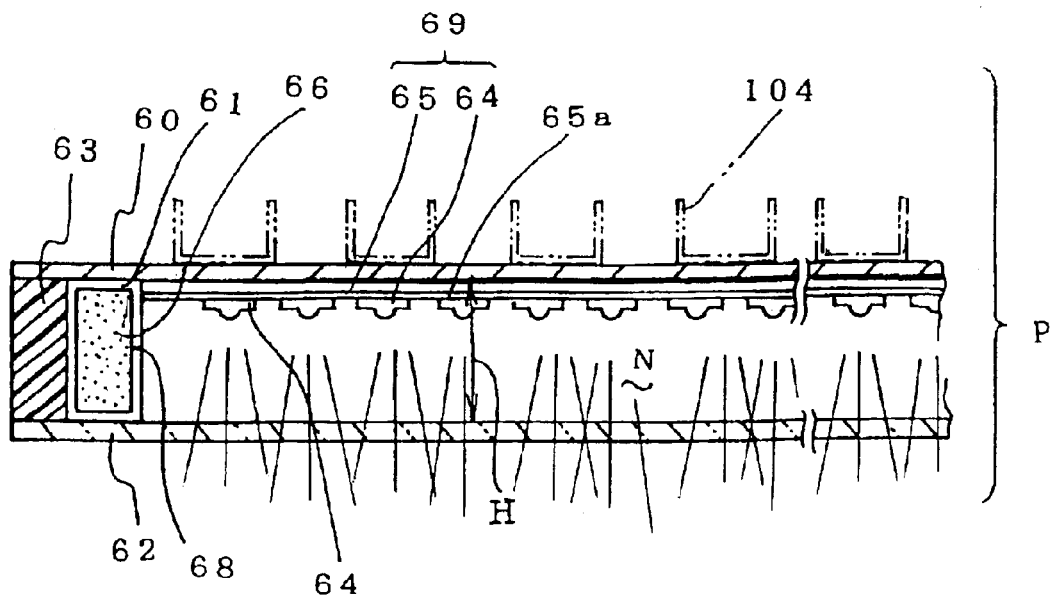
FIG. 11A is a cross sectional view of the main part of the light-emitting panel showing its other embodiment.

The light-emitting panel P shown in FIG. 11A comprises the base plate 60 composed of a metal plate having high heat conductivity such as aluminum and the cover 62 made of glass located with a space H facing the base plate 60. The base plate 60 and the cover 62 are rectangular respectively with the sandwiched frame 61 in between. The frame 61 is a rectangular pipe made by folding, for example thin metal plate, into a shape like C or into a square in cross section, inside of which there is a mating face 68 among the edges. In the frame 61, a desiccant is filled in. A deoxidizer can be filled in together with the desiccant. The frame 61 can be made of synthetic resin.

In the space N between the base plate 60 and the cover 62 as shown in FIG. 11A, dry gas such as dry air is filled in. Around the frame 61, the sealing material 63 such as silicone sealant is applied to seal off the space N between the base plate 60 and the cover 62.

A method to fill in dry air in the space N is only to assemble the base plate 60, the frame 61 in which a desiccant is accommodated, and the cover 62 in a dry room. Even if the assembling is done in ambient air, the air becomes dry air by the influence of the desiccant 66 through the mating face 68. In the case that inert gas such as nitrogen gas is used, one of the method to fill in the gas can be as following; let the air out of the space on the one side, and the gas is filled in on the other side. In order to assemble the panel, the frame 61 and the base plate 60 or the cover 62 are tacked temporarily using double-stick tapes etc., and they can be integrated by applying sealing material 63.

The size of the base plate 60 and the cover 62 is not limited particularly, and various sizes of them ranging from 10 cm to about 5 m a side can be used. However, the sizes from 50 cm to 1 m a side, and particularly 1 m a side are preferable from the aspect of easiness in assembling, transportation, and high efficiency. Further, those of rectangular-shaped or stripe-shaped can also be used. It is preferable for the base plate 60 to be of the thickness ranging from 0.3 to 3 mm and for the cover 62 to be of the thickness ranging from 1 to 5 mm. The space H between the base plate 60 and the cover 62 are preferable to be in the range of 3 to 20 mm and particularly in the range of 5 to 10 mm, though it is different depending upon the panel size.

On the base plate 60 of the light-emitting panel P shown in FIG. 11A, heat radiation fins 104 can be mounted as shown in the imaginary line.

The fin 104 can be manufactured from a thin metal plate having high thermal conductivity such as aluminum and folded into C-shape. The fin 104 is preferable to be blown by an air blower.

Inside of the base plate 60, the light-emitting unit 69 are set in array, wherein a number of the lamps 64 is arranged on the surface of the board 65 made of thin aluminum plate etc. and the board 65 is tightly connected to the base plate 60 by brazing etc. so as to assure high thermal conductivity.

Figure 11B:
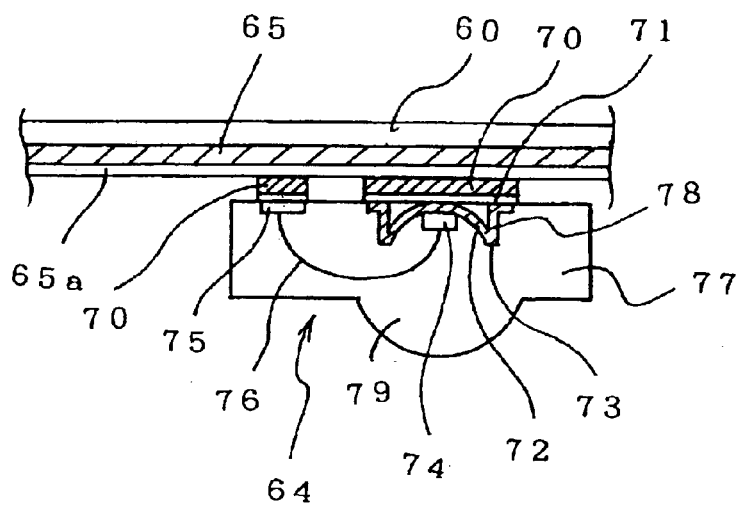
FIG. 11B is a main part of a light-emitting unit used in the above light-emitting panel.
Figure 12A:
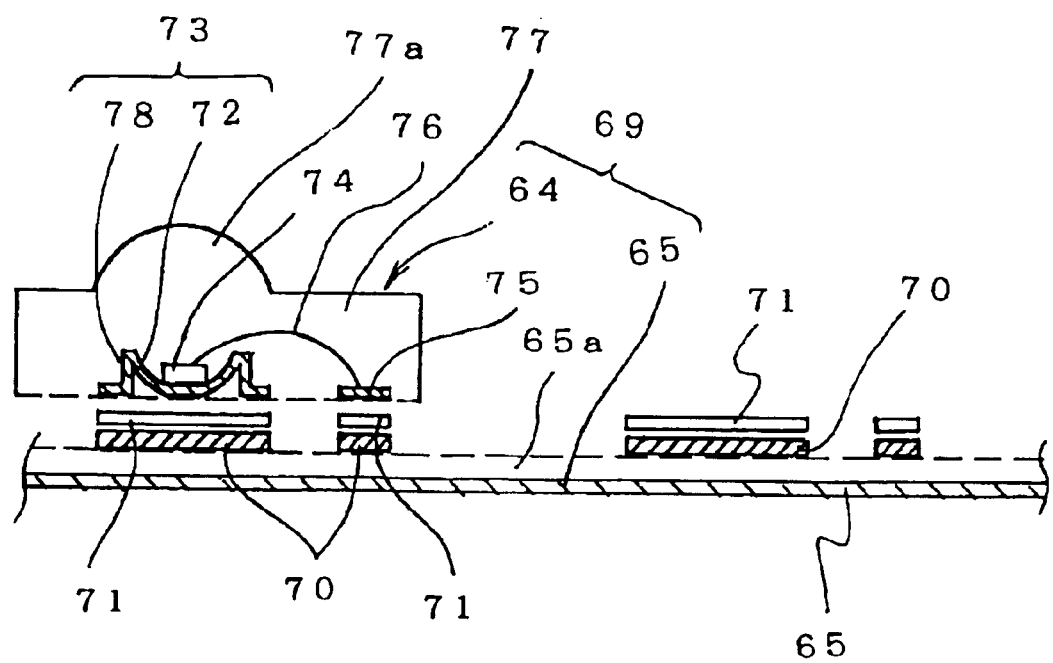
FIG. 12A is a cross sectional view of the light-emitting unit showing a manufacturing method of the unit.
Figure 12B:
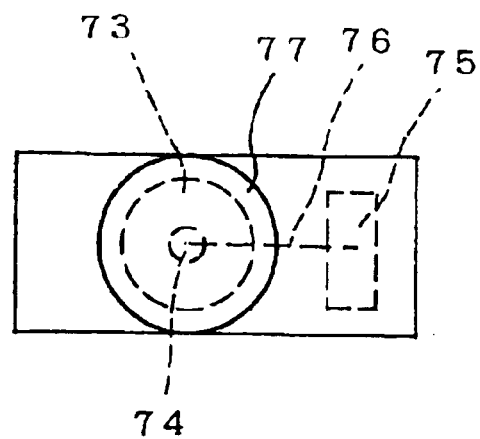
FIG. 12B is a plan view of the main part of FIG. 12A.

As shown in FIG. 11B and FIG. 12, the light emitting unit 69 is manufactured as follows; an insulation layer 65a made of inorganic material or organic material is laid on the board 65, on which a circuit pattern 70 is formed, and the lamp 64 is mounted in place after applying soldering cream 71 (soldering paste). Other metal plates can be used in lieu of the board 65 made of aluminum. Although, the insulation layer 65a is laid on all over the board 65, it can be laid only on the circuit pattern 70. The circuit pattern 70 is formed by plating the whole area with copper and removing unnecessary parts through an etching process. The soldering cream 71 is coated efficiently by making and printing the proof. Further, the board 65 can be made of insulating material, in which case the insulating layer 65a is not necessary.

The lamp 64 comprises a reflecting plate 73 made from thin copper metal shaped into dish by press work with its concave side 72 aluminized, a LED (Light-Emitting Diode) 74 mounted on the concave side 72 of the reflecting plate 73, an electrode 75 located on the same surface as that of the reflecting plate 73, a bonding wire 76 for bonding the LED 74 and the electrode 75, and a molding material 77 of epoxy resin etc. for enclosing the above described parts. In the reflecting plate 73, there is a residual circular projection 78 which spring up in the process of progressive casting in the press work.

The lower edge of the circular projection 78 can be used as the bottom for mounting the lamp 64 by leaving the edge as flat plane. Moreover, through the bottom part, the electrode 75 and the reflecting plate 73 of the other light-emitting unit can be left undivided and being cut off after enclosing with the molding material 77.

The molding material 77 is formed using translucent synthetic resin, especially thermosetting resin such as epoxy resin.

The molding material 77 has a spherical surface on its upper surface 77a facing the light-emitting diode (LED) 74, thereby increasing the light volume due to the lens action of the molding material 77. Furthermore, aluminizing of the concave side 72 of the reflecting plate 73 allows concentrated reflection of the light from the LED 74 increasing the light volume to the front direction.

The reflecting plate 73 and the electrode 75 can be made by integral forming using an insulating material such as a sheet of synthetic resin. In this case, a piece of copper plate etc. penetrating the upper and lower surface is inserted in each part before the molding process. As well, following processes of making electrical pass can be employed; a pass-through slot being made in each part and a electrically conductive material being filled in the slot, gold plated, or a combination of these processes.

The soldering cream 71 is a creamy micronized solder dissolved in a solvent and is publicly known. When heated, the solvent disappears into the air and the solder is melt down by heat, filling the space between the reflecting plate 73, electrode 75, and the circuit pattern 70 and hardened with fall of temperature. On these occasions, the lamp 64 is fixed on the board 65 firmly. As an electrically conductive adhesive, a material other than the soldering cream can be used.

FIG. 13A~D shows other methods to manufacture the light-emitting panel P. At first, a backing material 80 of metal long plate having high electrical conductivity such as a copper plate is pressed to form arrays of the area 81 where the lamp 64 is placed. In the press work, feed holes 82 such as perforation in photographic films are formed at the beginning, thereby enabling high feeding accuracy. Next, the transverse slit 83 at given interval is formed to allow easy press work between the slit 83.

Figure 13A:
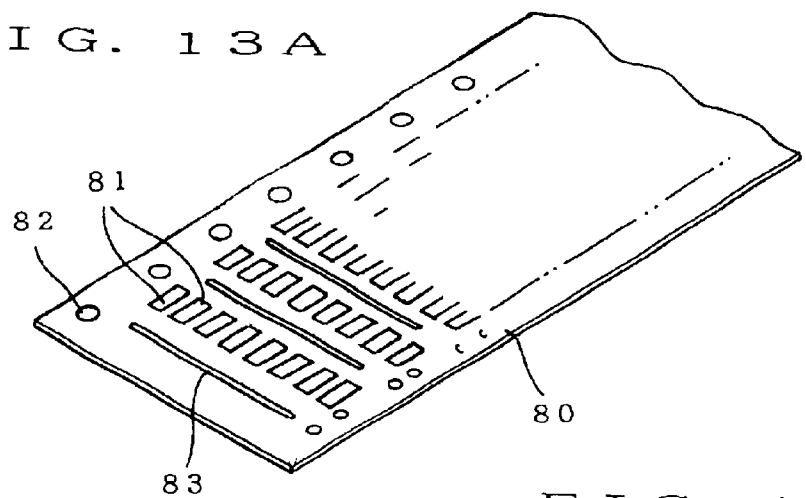
FIGS. 13A, 13B, 13C and 13D are rough process drawings showing the manufacturing method of the light-emitting panel of this invention.
Figure 13B:
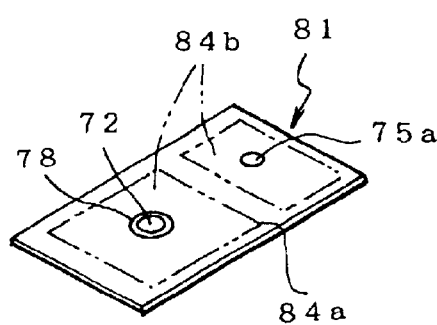

Further, as shown in FIG. 13B, the circular projection 78 whose inside surface is the concaved (mark 72) is formed. The reference numeral 75a is a part which becomes the electrode described above. The reference numeral 84a is an area removed later by the etching process and the reference numeral 84b is an area left intact. After the press work and masking, the concave side 72 is plated with white metal such as aluminum to form mirror surface for reflecting lights.

Figure 13C:
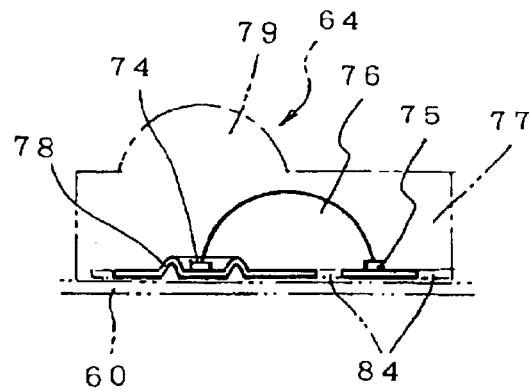
Figure 13D:
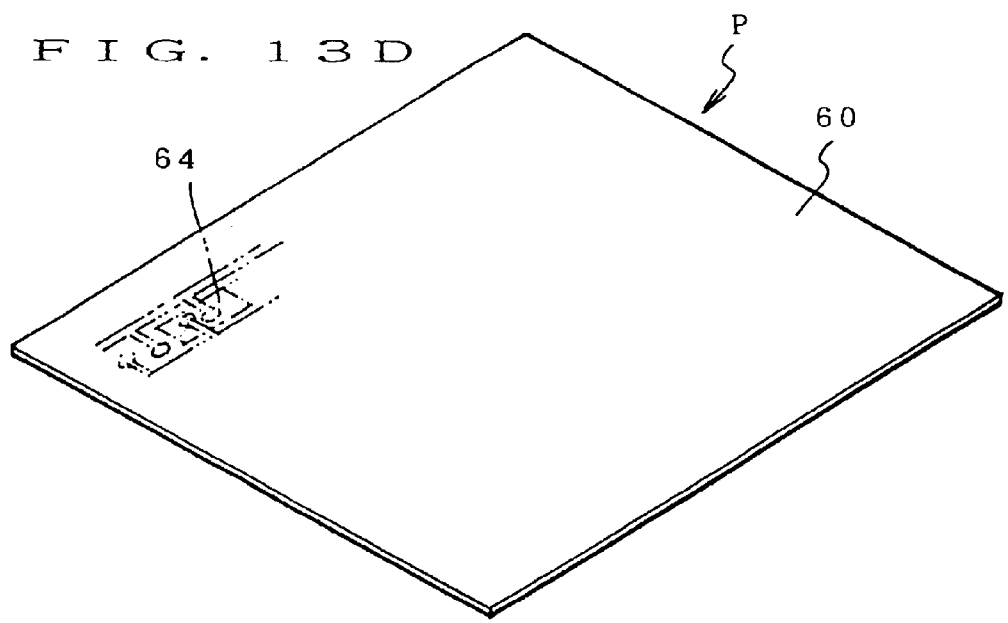
Figure 14A:
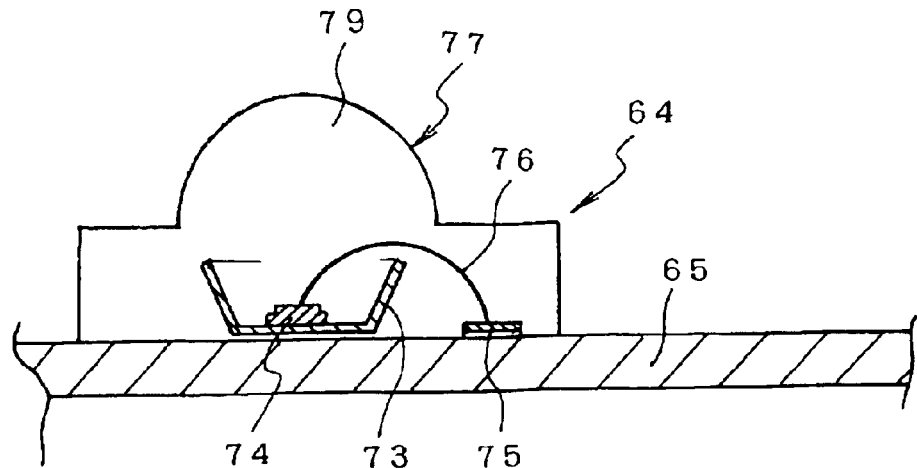
FIGS. 14A, 14B and 14C are rough process drawings of the showing the other embodiment of the manufacturing method of the light-emitting panel of this invention.
Figure 14B:
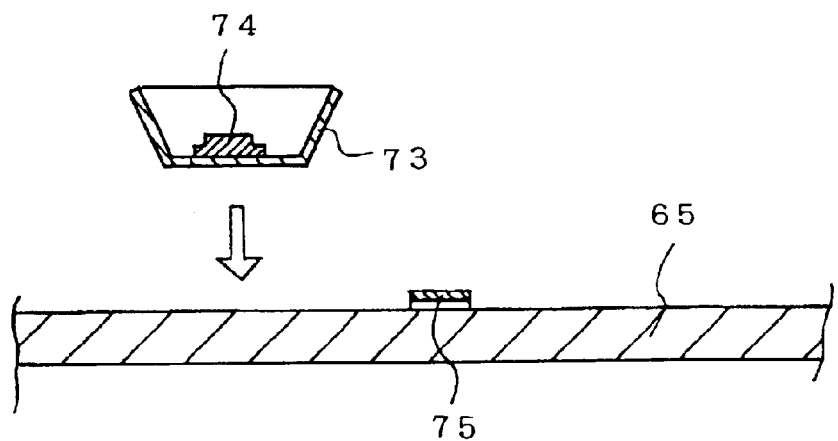
Figure 14C:
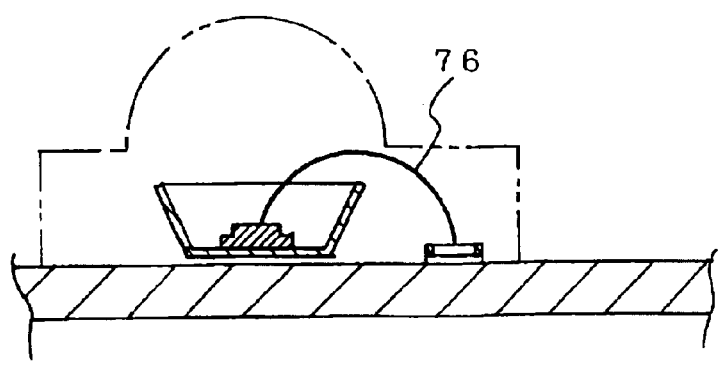

Then, as shown in FIG. 13C, the light-emitting diode 74 is fitted on the bottom of the concave side 72, and the electrode 75 is fitted on the area 75a. Further, the light-emitting diode 74 and the electrode 75 are bonded with the bonding wire 76, wherein the reflecting plate 73 is made to be electrically conductive so as to be the electrode of the light-emitting diode 74. Then, the molding material 77 is built in. The masking is done on the rear surface and the area 84a of copper is removed, thereby cutting off the light-emitting diode 74 side and the electrode 75 side and also cutting off the area 81 composing each lamp unit to get the lamp 64. The long sheet can be cut off in a line previously at suitable process. After the each lamp 64 is made, as shown in FIG. 13D, it is mounted at a proper position on the base plate 60 which also serves as a circuit board by a mounter, wherein the reflecting plate 73 and the electrode 75 are jointed directly by the method using soldering cream described above. In the case that the base plate 60 made from an aluminum plate etc. is used, an insulation layer and a circuit pattern are previously formed.

High precision working is required for the process of mounting the light-emitting diode and the electrode 75 and for the process of wiring with the bonding wire. However, since the area 81 for mounting the lamp can be positioned with relatively high precision, the work can be automated. Further, when the reflecting plate 73 and the electrode 75 are jointed to the base plate 60 after once each lamp 64 is manufactured, it does not require such a high precision work. So it can be mounted directly on the base plate 60 of the size about 1 m square. Therefore, any circuit board is not necessary to be provided separately enabling efficient manufacturing (Refer to FIG. 2).

Figure 15:
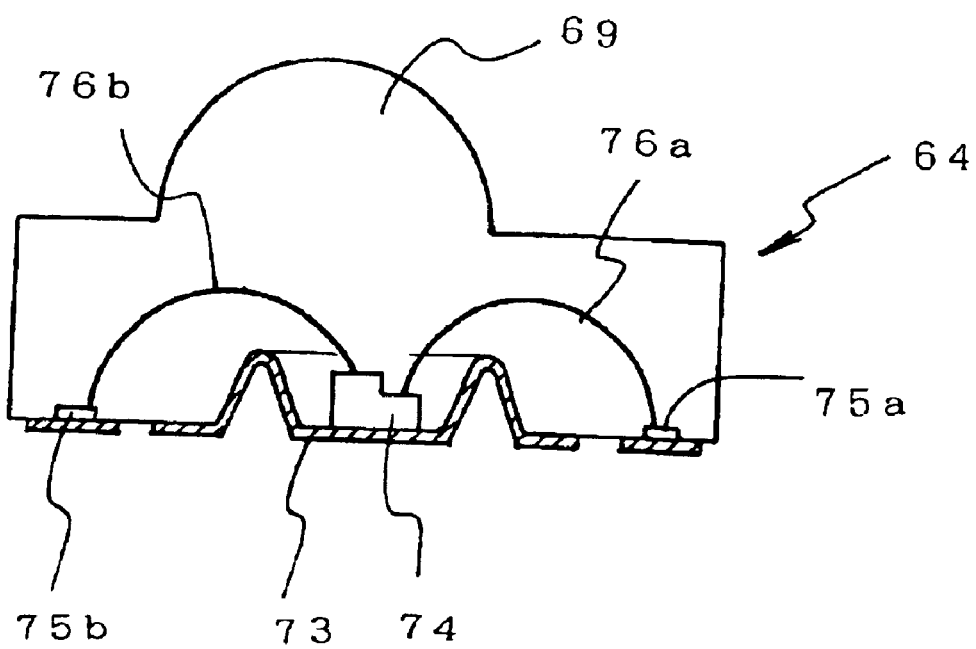
FIG. 15 is a cross sectional view showing the other embodiment of the lamps related to this invention.

In the lamp 64 shown in FIG. 15, the reflecting plate 73 on which the light-emitting diode 74 is mounted and the circuit is insulated each other, and the two electrode 75a and 75b are exposed on the undersurface of the lamp 64, wherein the light-emitting diode 74 and the each electrode 75a and 75b is wired with the bonding wire 76a and 76b. These compositions are used for blue light-emitting diodes 74. Other compositions are same as described above.

Figure 16A:
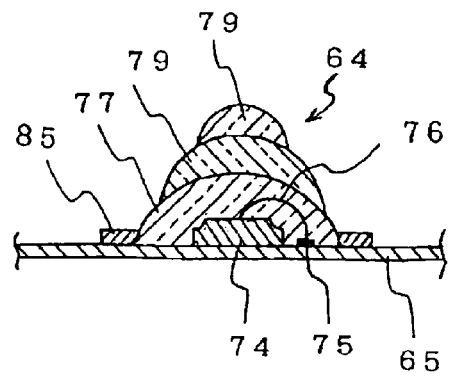
FIGS. 16A, 16B, 16C, 16D and 16E are cross sectional views showing an embodiment of the light-emitting element of the lighting device.

FIGS. 16a~f show an embodiment of light-emitting element using a light-emitting diode mounted on the undersurface of the light-emitting panel P. As shown in FIG. 16a, the lamp 64 comprises the light-emitting diode 74 fixed on the circuit board 65 made of aluminum etc., and the molding material 77 made of translucent, thermo-stable synthetic resin such as epoxy resin heaped up on the diode like semi-sphere or like convex lens 79. Further, in this embodiment, doubled layers of the second convex lens layer 79 and the third convex lens layer 79 are provided, wherein the reference numeral 75 shows a electrode, 76 shows a bonding wire, and 85 shows a kind of ring like a tundish 85 for preventing the molding material 77 to flow out.

The heaping up of the molding material 77 of the lamp 64 prevents the light from the light-emitting diode 74 to spread, and allows to emit straightforward, perpendicular to the base plate 65.

The second convex lens layer 79 and the third convex lens layer 79 also converges the light allowing strong illumination of plants with the lights. Resultantly, employment of this light-emitting panel P as a lighting device 3 enables further efficient plant cultivation.

Figure 16B:
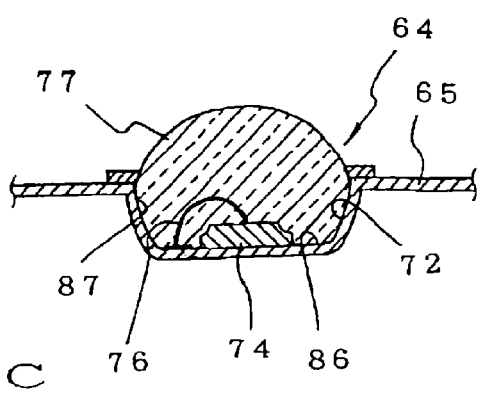

The lamp 64 in FIG. 16b is provided with a concave of about 0.9 mm depth on the board 65, wherein the concave is mirror finished to reflect lights and the upper surface of the molding material 77 filled in the concave is heaped up like convex lens.

Concerning inside of the concave 72, the bottom 86 is plane to mount the electrode 75, while the side 87 is curved like concave mirror. The light emitted from the light-emitting diode 74 is reflected by the inside face and converged at some level and further converged by the convex lens function of the molding material 77.

Figure 16C:
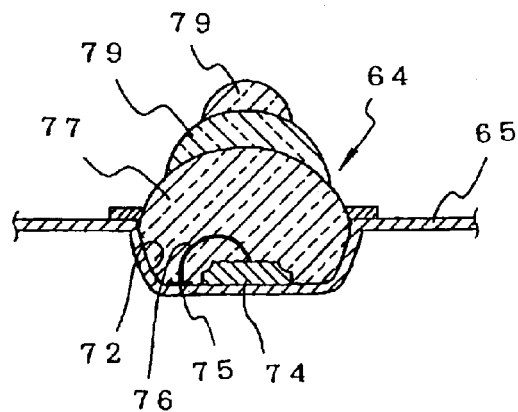
Figure 16D:
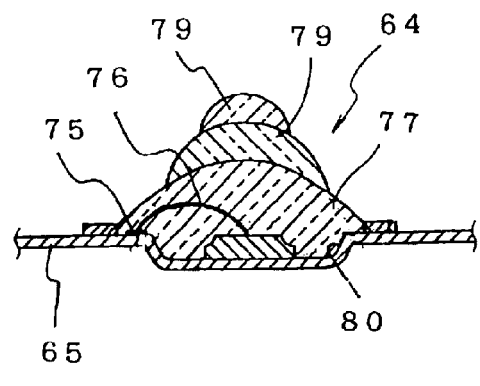

The lamp 64 shown in FIG. 16c is a combination of the three layer convex lens structure shown in FIG. 16a and the inside reflecting mirror structure shown in FIG. 16b, thereby achieving both functions. The lamp 64 shown in FIG. 16d has about the same structure as that shown in FIG. 16c. However it differs in the point that the depth of the concave is a little shallow, the electrode 75 is provided on the surface of the board 65, and that the molding material 77 has wider area than the concave so as to cover the electrode 75. This has substantially the same function as that shown in FIG. 16c and further provides easy bonding with the bonding wire 76.

Figure 16E:
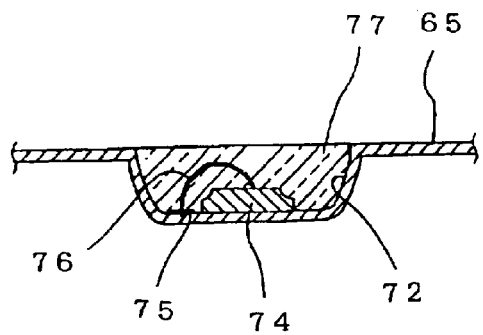

The lamp 64 shown in FIG. 16e is the same as the light-emitting element shown in FIG. 16b~10d except for the point that the upper surface of the molding material 77 is in plane with the surface of the board 65. Although this has no lens function, the light is converged at some level by the concave mirror function of the concave 72 allowing a enough light strength to reach the plants.

Figure 17:
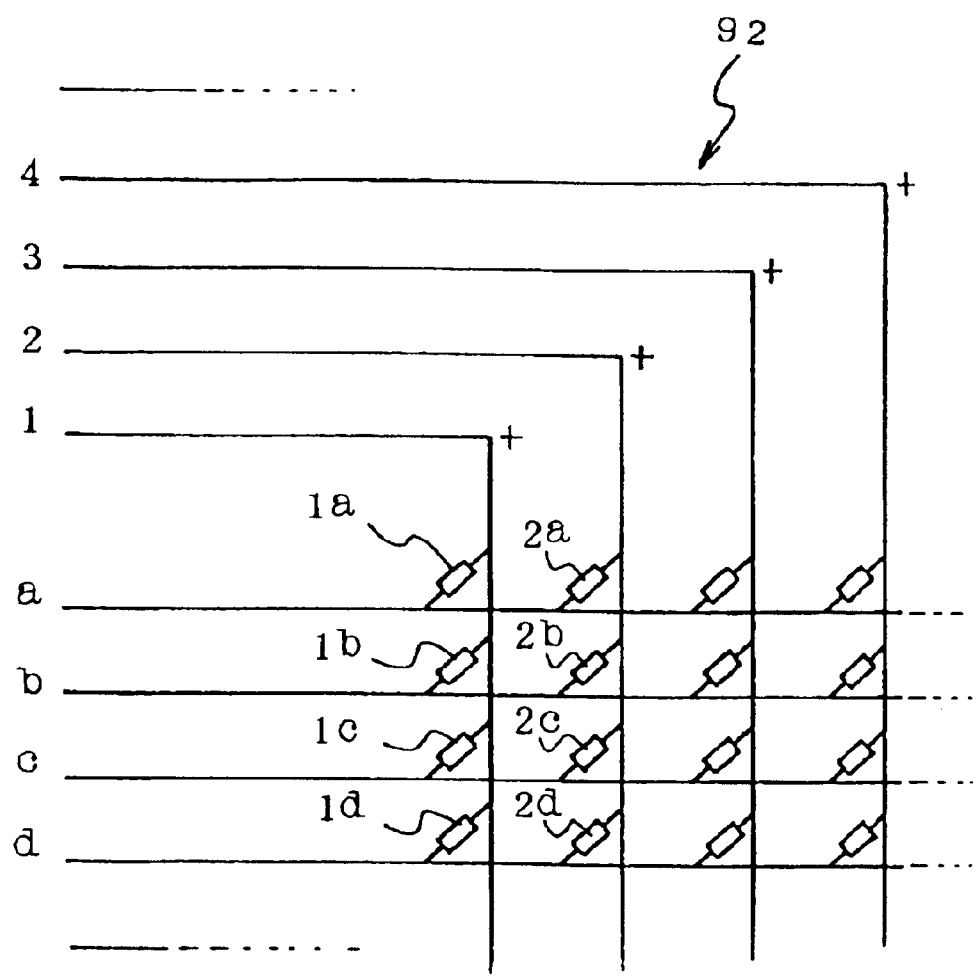
FIG. 17 is a schematic diagram showing an embodiment of a control circuit of the light-emitting panel.

FIG. 17 shows an embodiment of an electrical circuit to make a number of light-emitting diodes. The Reference Numeral 1,2,3 . . . show positive pole wires and the Reference Alphabet a, b, c, d . . . show negative pole wires. The positive pole wires 1,2,3 . . . and negative pole wires a, b, c intersect like a grid pattern to compose a matrix circuit 92 in which each cross way has a light-emitting element 1a, 1b, 1c, 2a, 2b, 2c and so on. Based on a signal generated from a control which is not shown in the figure, a voltage is applied to the positive poles selectively and the corresponding negative poles are grounded, which make the light being emitted from the light-emitting elements on the cross way of the working positive pole wires and the negative pole wires. Arbitrary setting of the positive pole wire voltage enables to increase or decrease illumination intensity of the light-emitting diode in a given location, which allows display of letters or specified patterns.

When light-emitting elements in a particular area are degraded due to the humidity and temperature causing decrease in illumination intensity, it is possible to increase illumination intensity of those elements to make the whole intensity flat.

In this case, a feedback control circuit to obtain flat intensity on a steady basis is composed as follows; sensors using a photo transistor for detecting the intensity in the specified area are provided in several locations, and an arithmetic circuit such as a central processor (micro processor) applies a suitable voltage to each positive pole wire based on the output of those sensors, thereby nearly flat intensity being secured over the whole light-emitting panel. In the case of a light-emitting panel for use as plant cultivation, precise control such as partial increase of the illumination intensity around the plants or nearby area can be performed.

Figure 18A:
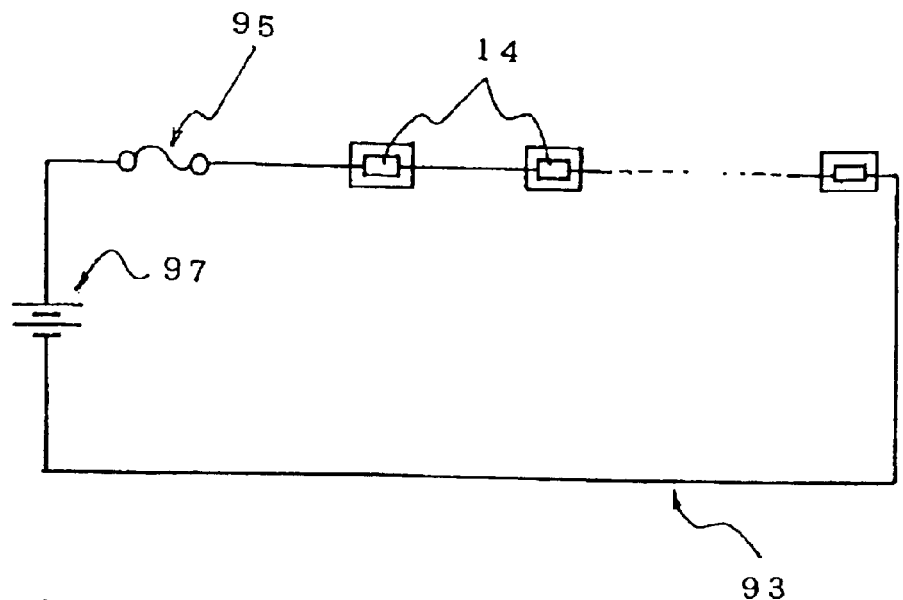
FIGS. 18A, 18B and 18C are schematic diagrams showing the other embodiment of the control circuit of the each light-emitting panel.
Figure 18B:
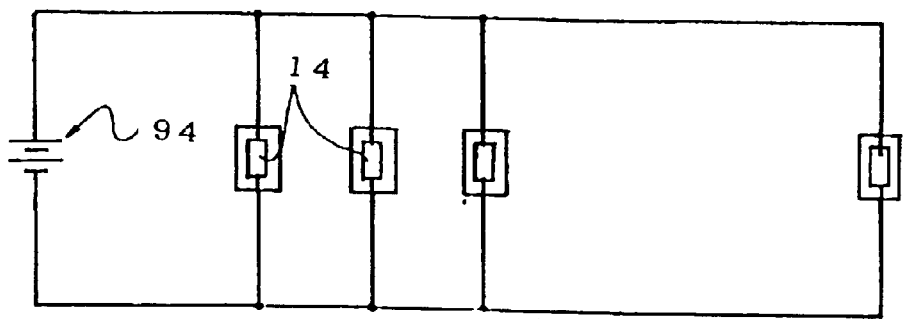
Figure 18C:
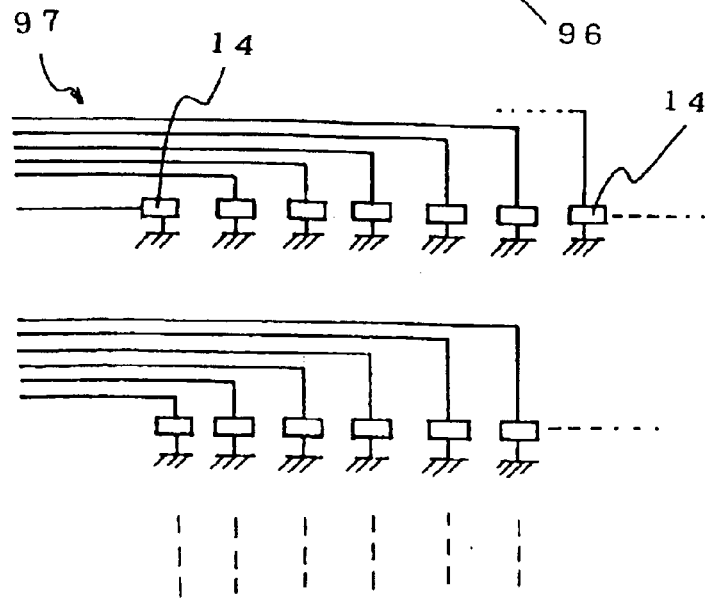

In the case that such a precise illumination intensity control is not needed, a publicly known series circuit 93 shown in FIG. 18A can be used. The Reference Numeral 94 in FIG. 18A is referred to a DC power source, 95 to a fuse, and 14a to a light-emitting element such as a light-emitting diode etc. Such a series circuit has a simple print pattern with short wiring. However, when conduction of a light-emitting diode becomes broken away, whole span of the light-emitting panel or the light-emitting unit goes out. Additionally, a parallel circuit 96 shown in FIG. 18B can be used in which broken away of a light-emitting element 14a does not have any effect on other light-emitting elements. Furthermore, as shown in FIG. 18C, a control wire 97 can be connected to every light-emitting diodes arranged in matrix and the each wire is on-off controlled or illumination intensity controlled. In this case also, micro-computers etc. can be used for performing precise control so as to make the illumination intensity flat or to change the illumination intensity by each block.

Figure 19:
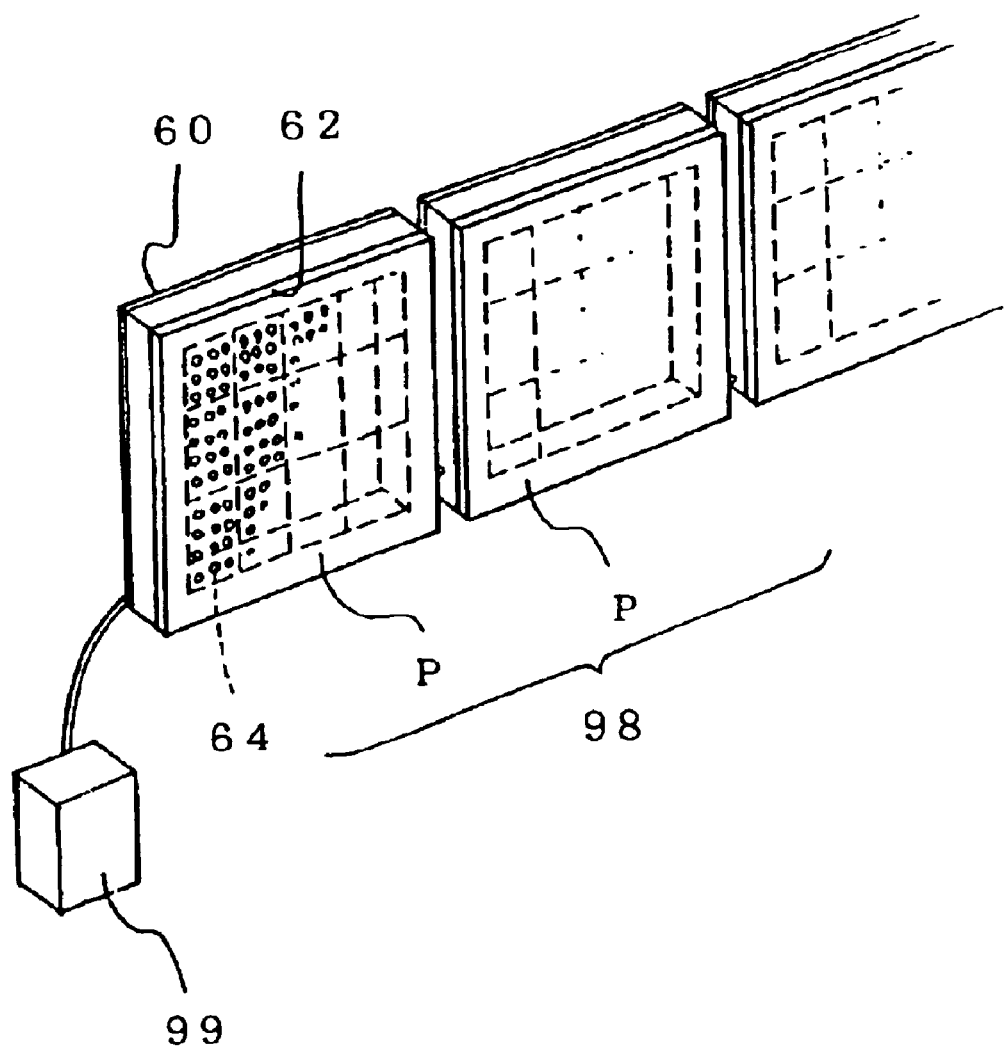
FIG. 19 is a perspective view showing an embodiment of an indicating panel using the light-emitting panel of this invention.

The light-emitting panel P composed as described above is used not only for plant cultivations but also for display panels 98 such as brake lights shown in FIG. 19 in single use or in combination use with multiple panels. The Reference Numeral 99 is referred to the control. The display panel 98 is scarcely degraded in a high humidity environment because of the lamp 64 being hermetically sealed.

Heat generated by the lamp 64 is efficiently radiated through the base plate 60 preventing the heat accumulation in the panel, which enhances durability of the light-emitting element resulting in long and stable operation of the display panel 98.

Figure 20:
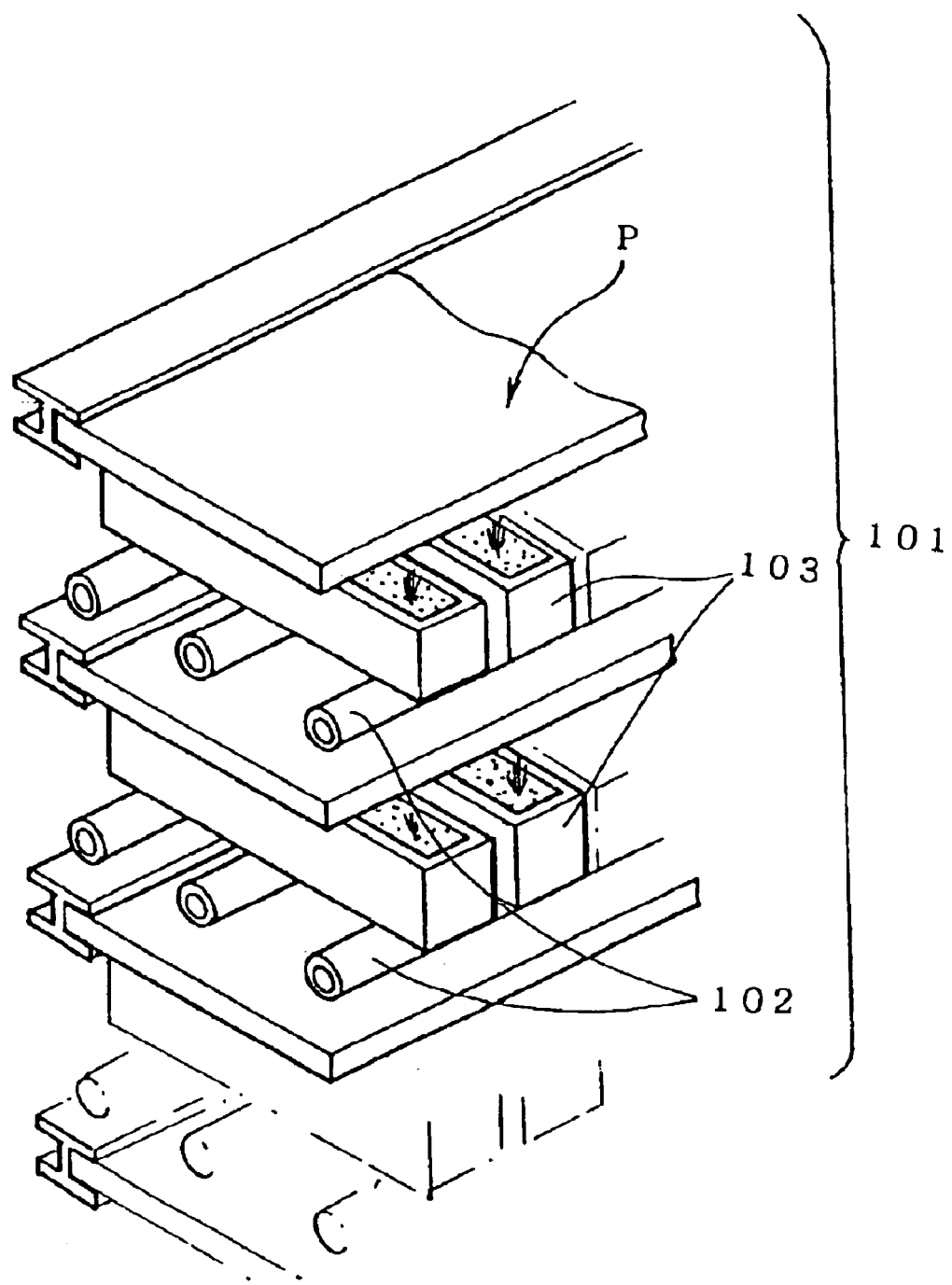
FIG. 20 is a perspective view showing an embodiment of a cultivating shelf using the light-emitting panel of this invention.

FIG. 20 shows the other embodiment of the light-emitting panel P. In this embodiment, the light-emitting panel P is located over the upper side of each shelf 102 of a stacked shelf 101. On the each shelf 102, a cultivating vessel 103 for plants to be cultivated is arranged. By this arrangement, the light from the lamp 64 is illuminated to the plants, and together with the supply of moisture and nutriment, temperature control, growth of the plants is promoted enabling efficient harvest.

In the case that the light-emitting panel is used as a lighting device for plant cultivation like above, the humidity is high in a room where the plant cultivating vessel 103 of the stacked shelf 101 is located.

However, since the lamp 64 is hermetically sealed between the base plate 60 and the cover 62 and the inner side is very dried with the desiccant 66, the lamp 64 is protected against the degradation due to humidity. Although, the amount of heat radiation from the lamp 64 is relative small compared with conventional fluorescent lamps, some amount of heat is radiated from the lamp 64 with its light-emission accumulating heat in the light-emitting panel P. But then, high heat conductivity of the base plate 60 brings efficient heat radiation from the upper side of the light-emitting panel P, protecting the lamp 64 also against the degradation due to heat.

Figure 21:
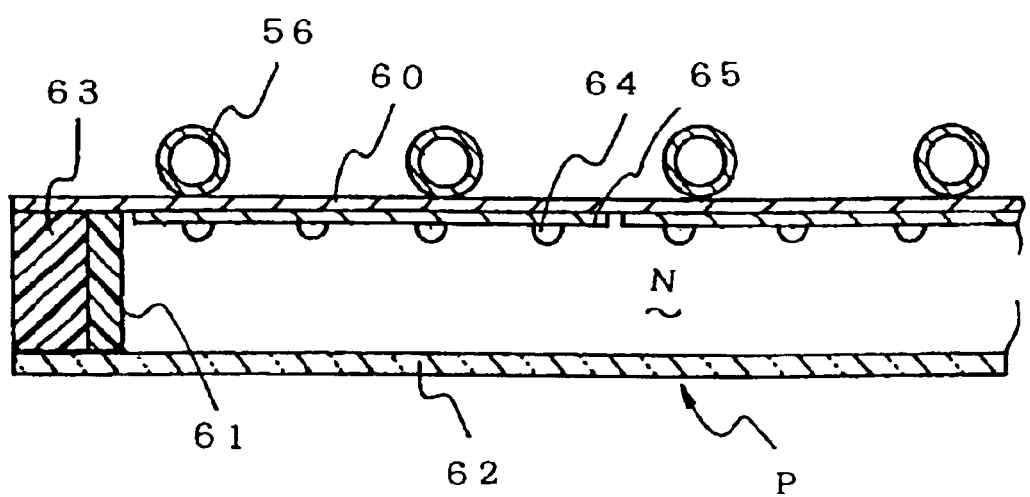
FIG. 21 is a cross sectional view showing the other embodiment of the light-emitting panel of this invention.

The light-emitting panel P in FIG. 21, the frame 61 made of synthetic resin is used in lieu of the frame accommodating a desiccant, which lowers the heat conduction from the cover 62 to base plate 60.

Furthermore, in the light-emitting panel P, the piping 56 for passing through cooling medium such as cooling water is closely in contact with the upper surface of the base plate 60. Cooling medium such as alternatives for chlorofluorocarbon or alcohol can be used, and cooling air can otherwise be passed through the piping or the duct. As well, in the light-emitting panel P of FIG. 10 and in the light-emitting panel P of FIG. 21, the board 65 is preferable to be closely in contact with the base plate 60, which conducts generated heat in the lamp 64 from the board 65 to the base plate 60 for efficient radiation.

Forced cooling of the base plate 60 by providing; good heat conduction from the board 65 to the base plate 60 enhancing heat radiation from the lamp 64; and the piping 56 for cooling medium, enables the more secure temperature control of the lamp 64. It is preferable for the light-emitting elements such as light-emitting diodes to be in a temperature as low as possible in order to achieve high efficiency.

In addition, when the shelf 102 in FIG. 20 is composed of a pipe, it is possible to run the cooling medium through the pipe into the piping 56.

Figure 22:
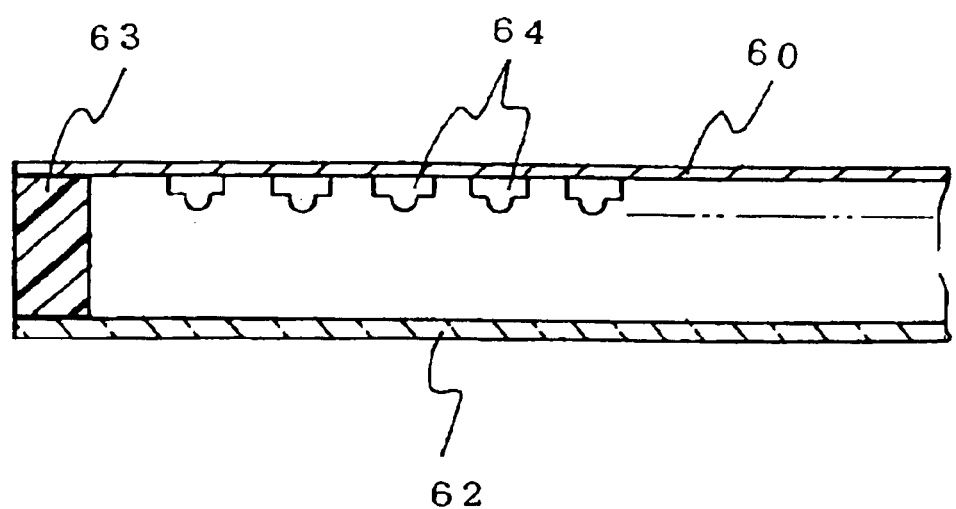
FIG. 22 is a cross sectional view showing the other embodiment of the light-emitting panel of this invention.

In the light-emitting panel P3 of FIG. 22, the lamp 64 is directly mounted on the base plate 60, in which the base plate 60 serves also as the board 65. Further in this embodiment, the frame sandwiched between the base plate 60 and the cover 62 is omitted and simply the sealing material 63 sustains the space in between.

This omission of the board(or the base) or the frame can be applied not only to relatively small light-emitting panels but also to panels about 1 m square by making the base plate 60 to serve as the board.

However, same as FIG. 11, the frame 61 can be provided. In addition, the light-emitting elements described herein include semi-conductor LASER and other illuminant various semiconductor devices as well as light-emitting diodes.

All the light emitting panel P employ the cover 62 made from a glass plate, but a cover made from a translucent synthetic resin plate such as an acrylic plate, and a laminated panel made from glass and synthetic resin plate or synthetic resin film can be employed.

What is claimed is:

1. A lighting-emitting panel, comprising;

base plate;

circuit board mounted on the base plate;

light-emitting unit provided with a number of lamps aligned and fixed on the circuit pattern of the circuit board;

translucent cover placed with a space adjacent to the base plate;

sealing material sandwiched between the base plate and the cover to keep the space airtight;

the lamps being fixed on the circuit board using a conductive adhesive; and a frame sandwiched between the base plate and the cover, wherein a sealing material is packed around the frame, the space is filled with inactive dry gas, and a desiccant and/or deoxidizer is accommodated inside of the frame.

2. A lighting-emitting panel according to claim 1, further comprising;

lamp provided with a concave reflecting plate;

light-emitting element mounted on the reflecting plate;

bonding wire to connect the light-emitting element and an electrode; and translucent molding material of synthetic resin to enclose the light-emitting element and the reflecting plate.

3. A light emitting panel according to claim 1, wherein the conductive adhesive is composed of soldering cream.

4. A light-emitting panel according to claim 1, wherein the base plate serves as a circuit board.

5. A light-emitting panel according to claim 1, further comprising:

a piping for cooling the light-emitting unit provided at a rear side.

* * * * *